United States Patent
Reboud et al.

(10) Patent No.: US 10,944,235 B2
(45) Date of Patent: Mar. 9, 2021

(54) METHOD FOR PRODUCING A LIGHT SOURCE AND LIGHT SOURCE

(71) Applicant: Commissariat A L'Energie Atomique et aux Energies Alternatives, Paris (FR)

(72) Inventors: Vincent Reboud, Grenoble (FR); Georgio El Zammar, Grenoble (FR); Rami Khazaka, Grenoble (FR); Sylvie Menezo, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 16/690,193

(22) Filed: Nov. 21, 2019

(65) Prior Publication Data
US 2020/0227894 A1    Jul. 16, 2020

(30) Foreign Application Priority Data
Nov. 22, 2018 (FR) ...................... 18 71722

(51) Int. Cl.
*H01S 5/00* (2006.01)
*H01S 5/02* (2006.01)
(Continued)

(52) U.S. Cl.
CPC ............ *H01S 5/021* (2013.01); *H01S 5/0203* (2013.01); *H01S 5/0206* (2013.01);
(Continued)

(58) Field of Classification Search
CPC .... H01S 5/3054; H01S 5/0203; H01S 5/0206; H01S 5/32; H01S 5/4043; H01S 5/021;
(Continued)

(56) References Cited

U.S. PATENT DOCUMENTS 6,500,257 B1    12/2002  Wang et al.
7,603,016 B1 *  10/2009  Soref ...................... B82Y 20/00
                                                          385/129
(Continued)

FOREIGN PATENT DOCUMENTS

EP    0 565 414 A1    10/1993
EP    0 951 055 A2    10/1999

OTHER PUBLICATIONS

French Preliminary Search Report dated Sep. 12, 2019 in French Application 18 71722 filed Nov. 22, 2018 (with English Translation of Categories of Cited Documents).
(Continued)

*Primary Examiner* — Kinam Park
(74) *Attorney, Agent, or Firm* — Oblon, McClelland, Maier & Neustadt, L.L.P.

(57) ABSTRACT

A light source comprises a GeSn active zone inserted between two contact zones. The active zone is formed directly on a silicon oxide layer by a first lateral epitaxial growth of a Ge germination layer followed by a second lateral epitaxial growth of a GeSn base layer. A cavity is formed between the contact zones by encapsulation and etching, so as to guide these lateral growths. A vertical growth of GeSn is then achieved from the base layer to form a structural layer. The active zone is formed in the stack of base and structural layers.

23 Claims, 14 Drawing Sheets

(51) Int. Cl.
  *H01S 5/30* (2006.01)
  *H01S 5/32* (2006.01)
  *H01S 5/40* (2006.01)
  *H01S 5/0625* (2006.01)
  *H01S 5/10* (2021.01)

(52) U.S. Cl.
  CPC ...... *H01S 5/06256* (2013.01); *H01S 5/06258* (2013.01); *H01S 5/105* (2013.01); *H01S 5/1014* (2013.01); *H01S 5/3054* (2013.01); *H01S 5/32* (2013.01); *H01S 5/4043* (2013.01); H01S 5/3013 (2013.01); H01S 2304/04 (2013.01)

(58) Field of Classification Search
  CPC ............. H01S 5/06256; H01S 5/06258; H01S 5/1014; H01S 5/3013; H01S 5/105; H01S 2304/04
  See application file for complete search history.

(56) References Cited

U.S. PATENT DOCUMENTS

| | | | |
|---|---|---|---|
| 2006/0189151 A1 | 8/2006 | Tweet et al. | |
| 2011/0227116 A1 | 9/2011 | Saito et al. | |
| 2014/0076386 A1* | 3/2014 | King | H01L 31/0443 136/255 |
| 2014/0185640 A1* | 7/2014 | Jain | H01S 5/021 372/45.011 |
| 2015/0372455 A1* | 12/2015 | Nam | H01S 5/3223 372/45.01 |
| 2018/0212399 A1* | 7/2018 | Menezo | H01S 5/1237 |
| 2018/0278025 A1* | 9/2018 | Leobandung | H01S 5/3428 |

OTHER PUBLICATIONS

European Search Report dated Mar. 26, 2020 in corresponding European Patent Application No. 19210242.4 (with English Translation of Category of Cited Documents), 12 pages.

* cited by examiner

B-B

C-C

Détail C

C-C

TE01

D-D

METHOD FOR PRODUCING A LIGHT SOURCE AND LIGHT SOURCE

TECHNICAL FIELD

The invention relates to the field of photonics and of optoelectronics. It has at least one particularly advantageous application in the field of light sources. It will have an advantageous, but non-limiting application, in producing germanium-based sources emitting in the mid-infrared (MIR) spectrum.

STATE OF THE ART

In the field of silicon photonics, a light source such as a laser or a light-emitting diode is a main optoelectronic component of optical communication systems which can be integrated into CMOS technology.

Such a component comprises an active zone based on a direct gap material, making it possible to emit and/or to amplify light.

A solution consists of returning one or more III-V materials on silicon Si. This solution implements complex technologies for hybridising III-V materials on Si. Furthermore, this solution is not fully compatible with CMOS technologies.

Alternatively, epitaxy of direct gap materials can be achieved directly on silicon.

For example, a germanium-tin GeSn alloy is a material which is compatible with CMOS technologies and could have a direct gap for certain tin concentrations and/or certain mechanical stress states.

The growth of such an alloy can be achieved from a germanium Ge layer extending in a basal plane on silicon. Such a Ge layer forms therefore a Ge virtual substrate (Ge-VS) from which GeSn is epitaxially grown.

The document "Optica Vol. 4, Issue 2, pp. 185-188 (2017)" presents an LED-type light source produced by growing GeSn on Ge-VS.

A disadvantage of this solution is the appearance of threading dislocations propagating vertically from the Ge/GeSn interface through GeSn.

These threading dislocations are non-radiative recombination sources. They decrease the emission efficiency of the light source.

Another disadvantage of this solution is that the GeSn alloy has a compressed mechanically stressed state in the basal plane.

It is then necessary to increase the tin concentration such that the gap of this alloy conserves a direct character.

For example, for a compression rate of around −0.75%, the gap is direct for a tin concentration greater than or equal to 13%, while for a relaxed GeSn alloy, a tin concentration of 8% to 10% can be enough to obtain a direct gap.

The increase of the tin concentration in the alloy also induces crystalline defects, which are non-radiative recombination sources.

An aim of the present invention is to overcome at least partially some of the disadvantages mentioned above.

According to a particular aspect, an aim of the present invention is to propose a method for producing a GeSn-based light source aiming to reduce the rate of threading dislocations in the active zone of the light source.

According to another aspect, an aim of the present invention is to propose a method for producing a GeSn-based light source aiming to relax the mechanical stresses in the active zone of the light source.

According to a separable aspect, an aim of the present invention is to propose a GeSn-based light source having an improved emission efficiency.

The other aims, features and advantages of the present invention will appear upon examining the following description and supporting drawings. It is understood that other advantages can be incorporated. In particular, certain features and certain advantages of the method can be applied mutatis mutandis to the light source, and reciprocally.

SUMMARY

To achieve this aim, a first aspect of the invention relates to a method for producing a light source comprising a first contact zone, a second contact zone and an active zone juxtaposed parallel to a first direction of a basal plane, said active zone being located between the first and second contact zones according to a second direction of the basal plane.

This method comprises the following steps:
providing a first substrate comprising a stack according to a third direction, normal to the basal plane of a first layer made from a first material on a second layer made from a second material different from the first material,
    forming, at the level of the first layer, the first contact zone,
    forming, at the level of the first layer, the second contact zone,
    forming, at the level of the first layer, the active zone.

Advantageously, but in a non-limiting manner, the active zone comprises a base layer, and this base layer is formed by the following successive steps:
    removing the first material in the active zone over the whole thickness of the first layer so as to expose, on the one hand, a portion of a lower face made from the second material, and on the other hand, at least one face made from the first material, normal to the basal plane, called lateral germination face, having an edge in contact with said exposed lower face,
    forming a germination layer in a third material with a first epitaxial growth, called first lateral growth, of said third material from the at least one lateral germination face, said first lateral growth being mainly directed along the second direction and at least partially guided by the exposed portion of the lower face, the germination face only partially covering the exposed portion of the lower face, such that the germination layer has at least one face made from the third material, normal to the basal plane, called lateral base face,
    forming the base layer in a fourth material differing from the third material and preferably made from the third material, with a second epitaxial growth, called second lateral growth, of said fourth material from the at least one lateral base face, said second lateral growth being mainly directed along the second direction and at least partially guided by the exposed portion of the lower face, such that the base layer, such that the exposed portion of the lower face is fully covered.

This method makes it possible to obtain a base layer by lateral growth, directly in contact with the second material.

Advantageously, such a lateral growth directed along the second direction makes it possible to limit the propagation of threading dislocations being propagated along the third direction from the interface between the third material and the fourth material.

The base layer in a fourth material thus has a reduced rate of threading dislocations. The base layer in a fourth material therefore has an optimised crystalline quality.

The method thus makes it possible to produce a light source of which the active zone formed from such a base layer has an improved crystalline quality.

Furthermore, for first, third and fourth materials each having a crystallographic structure of cubic type, in contact with a second amorphous material, such a lateral growth along a direction of type [010] makes it possible to limit the mechanical stresses in the basal plane. The method thus makes it possible to obtain a fourth mechanically relaxed material.

The base layer coming from this lateral growth is preferably thin, for example of between 10 nm and 50 nm thick. Such a base layer thickness is advantageously less than the critical thickness beyond which the fourth material relaxes by plastic deformation, i.e. by forming a network of dislocations, the elastic energy due to the mechanical stresses. A base layer thickness less than the critical thickness therefore does not have any dislocations.

According to a preferred possibility, the third material is germanium (Ge), and the fourth material is a germanium-tin (GeSn) or indium phosphorus (InP) alloy.

In this case, the method advantageously makes it possible to reduce the compressed stresses in GeSn or in InP in the basal plane.

In this case, the method according to the invention makes it possible to produce a light source wherein the active zone comprises a GeSn or InP base layer having a decreased compressed residual stress.

This method for producing a light source of which the active zone comprises or is formed from a GeSn base layer is therefore advantageously compatible with a reduction of the Sn concentration in GeSn. It furthermore makes it possible to improve the crystalline quality of the GeSn base layer, even to avoid the occurrence of dislocations in the GeSn base layer.

The light source resulting from this method, for example a coherent source such as a laser or a non-coherent source such as an LED, thus has an improved emission efficiency.

In particular, the laser emission threshold can be lowered. The laser emission can be done at ambient temperature.

The method according to the invention also makes it possible to obtain a GeSn base layer directly in contact with the second base layer of the second material. In the case of a dielectric second material, in silicon oxide for example, a GeOI (Germanium On Insulator)-type structure, is thus formed.

The light source resulting from this method, for example an LED, thus emits light more effectively. The light emitted in the active zone is indeed not trapped by a highly absorbent underlying layer, such as a virtual germanium Ge-VS substrate.

Furthermore, the relative arrangement of the active and contact zones induces a lateral injection of the charge carriers in the active zone.

The method according to the invention therefore makes it possible to obtain lateral injection GeOI-type light sources having an optimised crystalline quality.

Such light sources also constitute a separable aspect of the invention.

According to a preferred embodiment of the invention, a structural layer in a material made from the material of the base layer, preferably in the same material as the base layer, is formed from an upper face of the base layer.

This structural layer is preferably formed by an epitaxial growth along the third direction, called vertical growth direction.

Such a structural layer obtained by homoepitaxy makes it possible to form, stacked with the base layer, a zone in a fourth material having a greater thickness while advantageously conserving an optimal crystalline quality of the fourth material over the whole thickness of said zone.

The rate of threading dislocations is thus reduced both in the base layer and in the structural layer.

The compressed stress in the basal plane of a GeSn structural layer grown on a relaxed GeSn base layer, is also reduced. The tin concentration of such a GeSn structural layer can thus be decreased by conserving the direct gap property for this material.

Advantageously, the active zone can be formed in the stack of base and structural layers, for example, over the whole height of the stack.

The active zone is thus formed directly on the second layer of the substrate. This makes it possible to effectively confine the emitted light in the active zone, for example according to particular light propagating optical modes.

Such a confinement is advantageous, for example for an active zone used as an amplifying environment.

According to a preferred embodiment of the invention, the germination and base layers are grown within a cavity formed previously.

In particular, this cavity comprises the at least one lateral germination face, a lower wall and an upper wall. The lower and upper walls are preferably made from a dielectric material taken from among silicon oxide and a silicon nitride. The first and second lateral growths mainly directed along the second direction are therefore restricted along the third direction. The formation of the germination and base layers is thus better controlled. The crystalline quality of the germination and base layers is thus improved.

The method according to the invention makes it possible, in particular, to obtain GeSn-based light sources having an improved emission efficiency and/or an improved emission threshold.

A second separable aspect of the invention relates to a light source comprising a first contact zone, a second contact zone and an active zone formed in a first layer made from a first material and juxtaposed so as to extend parallel along a first direction, said active zone being located between the first and second contact zones along a second direction, the first layer being in contact with a second layer made from a second material differing from the first material, along a third direction perpendicular to the first and second directions.

Advantageously, the light source comprises a germination layer in a third material differing from the first and second materials and directly in contact with the second material of the second layer.

The germination layer is inserted along the second direction between the active zone and at least one from among the first and second contact zones.

The active zone is formed along a thickness of the first layer and comprises a fourth material differing from the third material and preferably made from the third material.

The fourth material is directly in contact with the second material of the second layer and with the third material of the germination layer.

Such a light source makes it possible to optimise the optical confinement along the third direction in the active zone.

Advantageously, the arrangement of such a germination layer inserted along the second direction and in contact with the active zone makes it possible to form the active zone from an epitaxial growth of the fourth material directed along the second direction.

Such a growth makes it possible to limit the occurrence of threading dislocations, i.e. directed along the third direction, within the active zone. Such a growth also makes it possible for the first, third and fourth material each having a crystallographic structure of cubic type, to limit the mechanical stresses in the basal plane. Therefore, the fourth material of this light source is mechanically relaxed.

The thickness of the active zone of such a light source can furthermore be increased by a homoepitaxy of the fourth material along the third direction, by advantageously conserving a reduced rate of threading dislocations.

Such a light source therefore advantageously comprises an active zone having a low dislocation rate, low residual stresses and a high thickness of the fourth material, for example over the whole thickness of the first layer.

According to a possibility, the first material is silicon, the second material is a dielectric material such as a silicon oxide, the third material is germanium and the fourth material is a germanium-tin or indium-phosphorus alloy.

According to a preferred possibility, the fourth material of the light source is a direct gap light source and is mechanically relaxed.

The light source according to the invention can be produced by the method according to the first aspect of the invention.

BRIEF DESCRIPTION OF THE FIGURES

The aims, objectives, as well as the features and advantages of the invention will emerge better from the detailed description of embodiments of the latter which are illustrated by the following supporting drawings, wherein.

Figure 1:
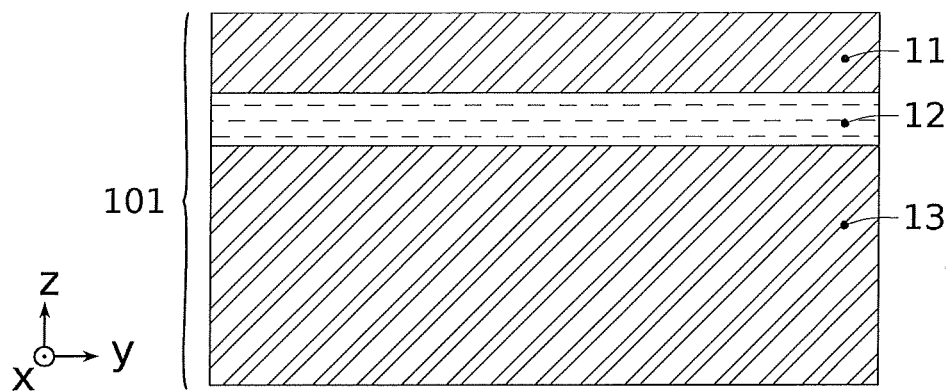
FIGS. 1 to 18 illustrate steps of producing a light source according to a first embodiment of the present invention.

The drawings are given as examples and are not limiting of the invention. They constitute schematic representations of principle intended to facilitate the understanding of the invention and are not necessary to the scale of practical applications. In particular, the thicknesses and dimensions of the different layers and portions of the light sources illustrated are not representative of reality.

DETAILED DESCRIPTION

Before starting a detailed review of embodiments of the invention, it is reminded that the invention, according to the first aspect thereof, possibly comprises in particular the optional features below, which could be used in association or alternatively:

the active zone A further comprises a structural layer in a fifth material made from the fourth material, said structural layer being formed with a epitaxial growth, called vertical growth, of the fifth material along the third direction from an exposed portion of an upper face 501 of the base layer 50.

the removal of the first material in the active zone A over the whole thickness of the first layer comprises the following successive steps:

Removing the first material of the first layer by conserving a sacrificial layer 30 made from the first material on the second layer, said sacrificial layer having a residual thickness e along the third direction and a width w along the second direction, Encapsulating the sacrificial layer 30 by an encapsulation layer 40 in an encapsulation material differing from the first material, Forming at least one opening 41 through the encapsulation layer 40, so as to expose a zone of the sacrificial layer, Forming a width cavity 42 ws by removing the first material over the whole residual thickness of the sacrificial layer (30) through the at least one opening 41, so as to expose the lower face 424 made from the second material, the at least one lateral germination face 421 and a face 423 of the encapsulation layer, the cavity 42 comprising said at least one lateral germination face 421, a lower wall formed by said lower face 424 and an upper wall parallel to the basal plane and made from the encapsulation material formed by said face 423 of the encapsulation layer 40, such that the first lateral growth leading to the formation of the germination layer and the second lateral growth leading to the formation of the base layer 50 are at least partially guided by said lower and upper walls, the germination layer and the base layer 50 having thicknesses equal to the residual thickness e.

The formation of the at least one opening is configured such that the exposed zone of the sacrificial layer 30 is located outside of the active zone A, preferably at a distance greater than 1 μm from the active zone;

the at least one opening 41 has a closed edge and is distant from at least one from among the first and second contact zones 1, 2 of a distance d along the second direction y such that 0.6 μm<d<1.5 μm and preferably 1.1 μm<d<1.5 μm;

the at least one opening is located along the second direction at an equal distance from the first and second contact zones 1, 2;

the formation of the structural layer further comprises, before the vertical growth, the following step:

Forming at least one lateral layer 61, 62 having lateral walls, substantially normal to the basal plane in a material differing from the first material, said at least one lateral layer 61, 62 bearing on a face parallel to the basal plane comprising the upper face 501 of the base layer 50, such that the vertical growth leading to the formation of the structural layer 51, that is at least partially guided by said lateral walls.

The method comprises the following sub-steps before forming the at least one lateral layer 61, 62:

Partially removing the encapsulation layer 40 so as to partially expose a face parallel to the basal plane comprising the upper face 501 of the base layer 50, by leaving a portion of the encapsulation material so as to form the at least one lateral layer 61, 62.

The method comprises the following sub-step before forming the at least one lateral layer:

Totally removing the encapsulation layer 40 so as to expose a face parallel to the basal plane comprising the upper face 501 of the base layer 50, Forming at least one lateral layer in a material taken from among a silicon oxide or a silicon nitride.

The at least one lateral layer 61, 62 has a width w1, w2 along the second direction greater than or equal to 10 nm and/or less than or equal to 100 nm.

The first, third and fourth materials, each having a crystallographic structure of cubic type.

The first direction corresponds to a crystallographic orientation of type [100], the second direction corresponds to a crystallographic orientation of type [010], and the third direction corresponds to a crystallographic orientation of type [001].

The removal of the first material during the formation of the cavity is done by etching, said etching being configured to produce an etching speed at least 25% greater in crystallographic directions [110] and [1-10] than in crystallographic directions [010] and [100] of the first material of the first layer, and preferably at least 35% greater.

The width ws of the cavity is less than the width w of the sacrificial layer, such that the sacrificial layer 30 forms at least one step 31 between the second layer 12 and the first layer 11.

The germination layer has a thickness equal to the thickness of the step 31.

The base layer 50 has a thickness equal to the thickness of the germination layer.

The base layer 50 has a thickness greater than or equal to 10 nm and/or less than or equal to 50 nm.

The germination layer has a width greater than or equal to 10 nm and/or less than or equal to 100 nm.

The germination layer has a thickness greater than or equal to 10 nm and/or less than or equal to 50 nm.

The second lateral growth has a first growth front from a first lateral base face and a second growth front from a second lateral base face, said first and second growth front are joined at the level of a joining zone to form the base layer, and wherein the base layer 50 comprises said joining zone.

The base layer 50 is partially etched along the third direction at the level of the joining zone.

The structural layer is partially etched along the third direction at an area extending from the joining zone.

The method further comprises a formation at the level of the first layer of a waveguide in direct coupling with the active zone.

The method further comprises a formation of a waveguide in evanescent coupling with the active zone A.

The first substrate 101 comprises a third layer 13, such that the second layer 12 is inserted between the first and third layers 11, 13 along the third direction z, and the method further comprises a sequence of steps of returning the light source on a second substrate 102, said sequence comprising the following steps:

providing a second substrate 102, bonding, by molecular adhesion, the second substrate 102 to the first substrate 101 along the third direction z, the first layer 11 of the first substrate 101 being rotated facing the second substrate 102, removing the third layer 13 from the first substrate 101, forming at least the second layer of the first substrate of the first and second metal contacts respectively on the first and second contact zones.

The first lateral growth leading to the formation of the germination layer is achieved at least partially at a first temperature T1 of between 400° C. and 450° C.

The first lateral growth leading to the formation of the germination layer is achieved at a temperature of between 400° C. and 600° C., and at least partially at the first temperature T1 called low temperature of between 400° C.<T1<450° C.

The second lateral growth leading to the formation of the base layer 50 is achieved at a second temperature T2 of between 300° C. and 400° C.

The second lateral growth leading to the formation of the base layer is achieved at a temperature of between 300° C. and 700° C., and at least partially at the second temperature T2 of between 300° C. and 400° C.

The vertical growth leading to the formation of the structural layer is achieved at the second temperature T2 of between 300° C. and 400° C.

The vertical growth leading to the formation of the structural layer is achieved at a temperature of between 300° C. and 700° C., and at least partially at the second temperature T2 of between 300° C. and 400° C.

The method further comprises a step of forming distributed Bragg reflectors in an upper portion of the active zone A.

The method comprises, after formation of the active zone A, a step of structuring a surface of the active zone, said structured surface being configured to optimise an extraction of the light emitted, outside of the active zone.

The first material is silicon or silicon-germanium, the second material is a dielectric material, the third material is germanium and the fourth material is a germanium-tin GeSn, indium phosphorus alloy or a material III-V.

The invention according to the second aspect thereof possibly comprises, in particular, the optional features below, which could be used in association or alternatively:

at least one from among the first and second contact zones 1, 2 has a step facing the other from among the first and second contact zones, said step bearing on the second layer 12 and being located between the first layer 11 and the active zone A.

The step is located between the first layer 11 and the germination layer.

The step has a thickness e along the third direction greater than or equal to 10 nm and/or less than or equal to 50 nm.

The step has a width w1, w2 along the second direction greater than or equal to 10 nm and/or less than or equal to 100 nm.

The step has a thickness less than that of the active zone A.

The step has a thickness less than that of a main portion of at least one from among the first and second contact zones carrying the step.

The step has a step substantially equal to the thickness of the germination layer.

The light source further comprises at least one lateral layer bearing on the step and located between the first layer and the active zone, said at least one lateral layer being in a material taken from among a silicon oxide and a silicon nitride.

The germination layer has a thickness greater than or equal to 10 nm and/or less than or equal to 50 nm.

The first material is silicon or silicon-germanium, the second material is a dielectric material such as a silicon oxide, the third material is germanium and the fourth material is a germanium-tin GeSn or indium phosphorus InP alloy or a material III-V.

The fourth material is with a direct gap.

The fourth material is mechanically relaxed. Such a fourth mechanically relaxed material is advantageously obtained by the method according to the first aspect of the invention.

The index contrast between the second and fourth materials is greater than the index contrast between the first and fourth materials.

The active zone A comprises a fifth material made from the fourth material forming a stack along a third direction z with said fourth material.

The active zone A is configured to emit a light flow being propagated mainly along the first direction x according to an optical propagation mode of type TE01, called mode TE01.

The light source further comprises a mode converter 302, 301, 400 directly coupled to the active zone A, said mode converter 302, 301, 400 being configured to convert said mode TE01 into an optical propagation mode of type TE00, called mode TE00, preferably with a conversion efficiency greater than or equal to 95%, and preferably with a conversion efficiency greater than or equal to 97%.

Below, an active zone is a zone configured to emit photons. These photons can be generated directly by recombination of electric charge carriers injected at the level of the active zone, or by stimulated emission. The active zone is preferably in germanium-tin or in indium phosphorus in the present application. It can act as an electrically pumped amplifying environment.

In the present invention modes for guiding a light flow or a light wave will be indicated. A light wave is an electromagnetic wave comprising an oscillating electric field coupled to an oscillating magnetic field. When the light wave is confined in a waveguide or an optical cavity, for example, it is propagated according to different modes called transverse modes (due to conditions at the limits imposed by the confinement) among which:

TE (Transverse Electric) modes not having any electric field along the propagation direction. The corresponding fundamental mode is referenced TE00, the corresponding secondary modes are referenced TE01, TE10, TE11, TE02, TE12, etc.

TM (Transverse Magnetic) modes not having any magnetic field along the propagation direction. The corresponding fundamental mode is referenced TM00, the corresponding secondary modes are referenced TM01, TM10, TM11, TM02, TM12, etc.

It is specified that, in the scope of the present invention, the relative arrangement of a third zone inserted between a first zone and a second zone, does not compulsorily mean that the zones are directly in contact with one another, but means that the first zone is either directly in contact with the first and second zones, or separated from them by at least one other zone or at least one other element.

The steps of forming zones, in particular the active, contact and injection zones, extend in the broad sense: they can be carried out in several sub-steps which are not necessarily strictly successive.

In the present invention, doping types are indicated. These doping are non-limiting examples. The invention covers all the embodiments wherein the doping are reversed. Thus, if an embodiment example mentions for a first zone, a p doping and for a second zone, an n doping, the present description thus describes, implicitly at least, the reverse example wherein the first zone has an n doping and the second zone, a p doping.

The doping ranges associated with the different type of doping indicated in the present application are as follows:

p++ or n++ doping: greater than $1 \times 10^{20}$ cm$^{-3}$
p+ or n+ doping: $1 \times 10^{18}$ cm$^{-3}$ to $9 \times 10^{19}$ cm$^{-3}$
p or n doping: $1 \times 10^{17}$ cm$^{-3}$ to $1 \times 10^{18}$ cm$^{-3}$
intrinsic doping: $1.10^{15}$ cm$^{-3}$ to $1.10^{17}$ cm$^{-3}$ Below, the following abbreviations relating to a material M are possibly used:

M-i refers to the intrinsic or unintentionally doped material, according to the terminology usually used in the microelectronics field for the suffix -i.

M-n refers to the n, n+ or n++ doped material M, according to the terminology usually used in the microelectronics field for the suffix -n.

M-p refers to the p, p+ or p++ doped material M, according to the terminology usually used in the microelectronics field for the suffix -p.

A substrate, a film, a layer "made from" or "based on" a material M, or "M-based" means a substrate, a film, a layer comprising this material M only or this material M and possibly other materials, for example alloy elements, impurities or doping elements. Thus, a layer in a germanium (Ge)-based material can, for example, be a germanium (Ge or Ge-i) layer or a doped germanium (Ge-p, Ge-n) layer, or also a layer of a germanium-tin (GeSn) alloy. A layer in a silicon (Si)-based material can, for example, a silicon (Si or Si-i) layer or a doped silicon (Si-p, Si-n) layer.

In the present patent application, the first, second and third directions correspond respectively to the directions carried by the axes x, y, z of a marker, preferably orthonormal. This marker is represented in the figures appended to the first patent application.

Below, the length is taken along the first direction x, the width is taken along the second direction y, and the thickness is taken along the third direction z.

Below, a mechanically relaxed material means that this material has a residual stress value less than 200 MPa, and preferably less than 50 MPa.

Below, the faces or the edges are described, for reason of clarity, such as extending mainly along planes. These faces and these edges are not however strictly comprised in said planes, considering the manufacturing and/or measurement tolerances. These faces and these edges can have curves and/or angular deviations outside of said planes. The projection of a face or of an edge in the corresponding plane however preferably has a surface area greater than or equal to 80% of the surface of the face or of the edge. An orientation normal to a plane, in particular normal to the basal plane, shall be understood as adopting the geometric tolerance indicated above; in particular, the lateral germination face and the lateral base face cannot be strictly "vertical", but be inclined and/or not flat, to an extent that still permits the lateral growth support functions described above.

As the case may be, "lateral" means: an orientation of the walls or of the layers normal to y, a growth by epitaxy directed along y, an arrangement along y of the different zones or elements of the light source relative to one another.

To determine the geometry of the interfaces between the different layers, in particular between the sacrificial layer and the germination layer, and between the germination layer and the base layer, Scanning Electron Microscopy (SEM) or Transmission Electron Microscopy (TEM) analyses can be proceeded with.

Figure 19:
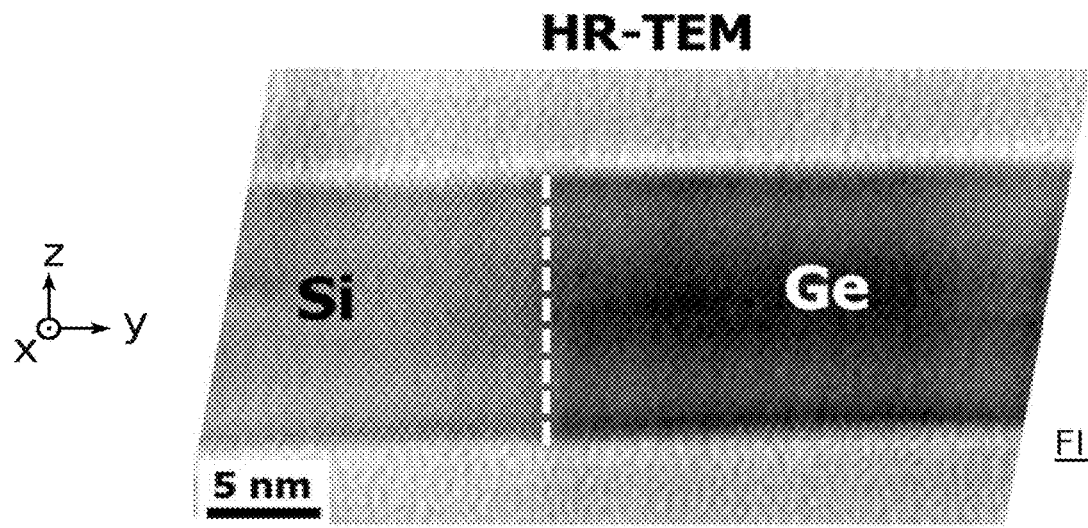
FIG. 19 shows a view through high-resolution transmission electron microscopy (HRTEM) in the transversal cross-section of a germination layer in Ge according to an embodiment of the present invention.

An epitaxial growth of a material on another produces a well-defined and substantially flat interface between these materials. In particular, a lateral epitaxial growth of Ge on a lateral face of Si produces a flat Si—Ge interface, potentially without any structural defects. Such an Si—Ge interface obtained by the method according to the invention is illustrated in FIG. 19 appended to the present application.

These techniques also make it possible to observe the presence of a step bearing on the second layer and being located between the first layer and the active zone of a light source according to the invention.

The chemical compositions of the different zones can be determined using following, well-known methods, such as:
EDX or X-EDS, ("energy dispersive x-ray spectroscopy").

This method is well-suited for analysing the composition of small devices such as light sources comprising thin layers or zones. It can be implemented on metallurgic cross-sections with a Scanning Electron Microscopy (SEM) or on thin slides within a Transmission Electron Microscopy (TEM).
SIMS, ("Secondary Ion Mass Spectroscopy").
ToF-SIMS, ("Time of Flight Secondary Ion Mass Spectroscopy").

These methods make it possible to access the elementary composition of the zones.

The structural quality of a layer can be studied by Transmission Electron Microscopy (TEM).

The threading dislocations can be, in particular observed by this technique and the derivatives thereof (weak beam and/or dark field observation, for example).

A first embodiment of the method according to the invention will now be described in reference to FIGS. 1 to 18. The light source obtained by this first embodiment is a laser source GeSn on insulator with lateral injection comprising an active zone A in GeSn-i inserted along y between a first contact zone 1 in Si-p and a second contact zone 2 in Si-n.

Advantageously, the active zone is obtained by three successive epitaxial growths. A first lateral epitaxial growth of Ge makes it possible, in particular, to form a germination layer. A second lateral epitaxial growth of GeSn makes it possible to form a base layer from the germination layer. This second lateral epitaxial growth is followed by a vertical epitaxial growth of GeSn so as to form a structural layer on the base layer.

According to the first embodiment, a first step consists of providing a substrate 101 (FIG. 1), preferably SOI (Silicon On Insulator); but materials other than silicon as also possible. The first silicon layer 11, also called top Si below, preferably has a thickness of between 100 nm and 700 nm, preferably substantially equal to 300 nm. The second silicon dioxide layer 12, also called BOX (Buried Oxide) has a thickness of between 10 nm and 3 µm, preferably of between 10 nm and 100 nm, preferably substantially equal to 20 nm. The third layer 13 is made of silicon and can also be called bulk Si below.

This substrate can have a diameter of 200 mm or 300 mm.

Figure 2:
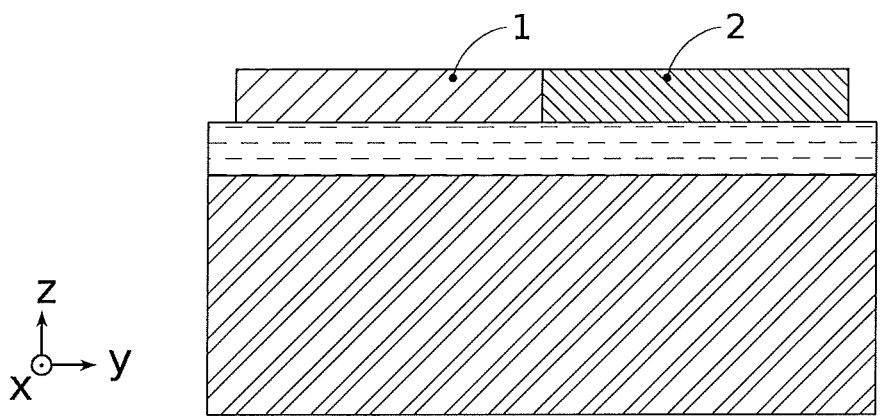

The following step consists of forming, at the level of the first layer 11, the first and second contact zones 1, 2, preferably by ion implantation over the whole thickness of the top Si 11 (FIG. 2). The first contact zone 1 can be p+ doped and have a concentration of dopants of between 1 to $3 \times 10^{19}$ cm$^{-3}$. It can have a width of around 15 µm or more.

The second contact zone 2 can be n+ doped and have a concentration of dopants of between 1 to $3 \times 10^{19}$ cm$^{-3}$. It can have a width of around 15 µm or more.

The first and second contact zones 1, 2 can be adjacent along a plane zx.

A step of defining a first pattern 300 comprising the first contact zone 1, the active zone A and the second contact zone 2 is preferably produced by lithography and selective etching of the top Si over the whole of the height thereof (FIG. 2). The selective etching of the top Si 11 with respect to the BOX 12 made of silicon dioxide is widely known and is not characteristic of the present invention.

The definition of a second waveguide-shaped pattern can also be produced by lithography and selective etching of the top Si over the whole of the height thereof, preferably during the definition of the first pattern 300.

Figure 15:
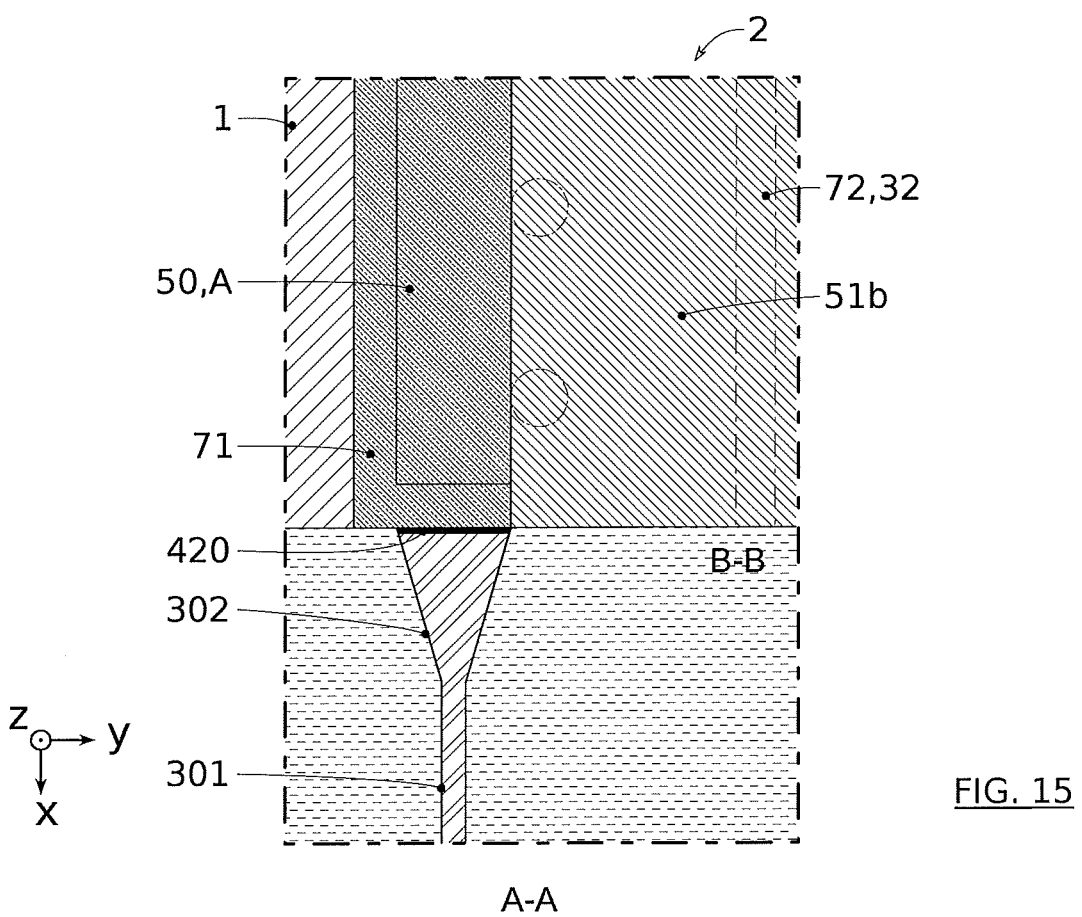

This waveguide 301 is preferably configured to engage with the active zone A by direct coupling (FIG. 15). The waveguide 301 preferably has a continuity with the active zone A of the first pattern 300, for example by way of a truncated cone-shaped connector called taper 302.

The waveguide 301 can be centred (or not) on the active zone A. It can have a width of between 300 nm and 600 nm, preferably of around 400 nm. The height thereof can be equal to that of the top Si 11.

The taper 302 can be configured to collect the light emitted in the active zone A and to transmit it in the waveguide 301. It makes it possible, in particular, to connect and/or to optically couple an active zone A to a waveguide 301, in the case where the active zone A has a width greater than that of the waveguide 301. Such tapers 302 are commonly used in optical communication systems on Si and are widely known.

Figure 3:
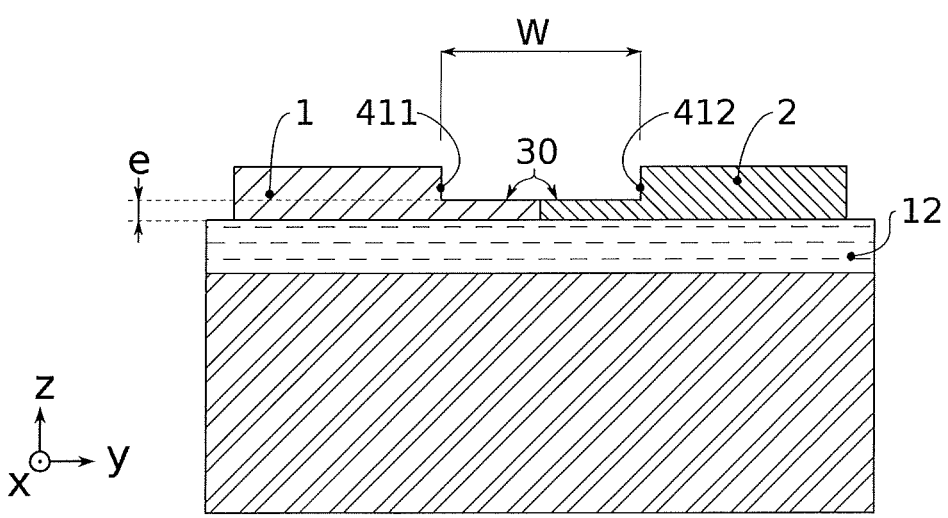

A first opening is produced by lithography and etching in the top Si 11 on a portion of the height thereof, called upper portion (FIG. 3).

This first opening is produced between the first and second contact zones 1, 2, and also preferably partially in the first and second contact zones 1, 2. It is located partially at the outlet of the taper 302 or waveguide 301.

It comprises first and second lateral faces 411, 412 along zx, and an outlet face along zy. These faces are also simply called edges.

This first opening preferably has a width w between the first and second lateral faces 411, 412 of between 1 μm and 4 μm, for example, around 3.2 μm.

It preferably has a length substantially equal to or slightly greater than the length of the first and second contact zones 1, 2, so as to separate said first and second contact zones 1, 2 on the upper portion.

This first opening makes it possible to expose a sacrificial layer 30 in contact with the BOX 12, in the lower portion of the top Si 11, without exposing the underlying layer, here the BOX 12 layer.

The etching of the top Si 11 is known per se. It is configured to be stopped in the top Si 11 so as to form a sacrificial layer 30 having a residual thickness e, preferably less than or equal to 50 nm, even 20 nm and/or greater than or equal to 10 nm (FIG. 3).

This sacrificial layer 30 of width w and of thickness e comprises a portion of the first and second contact zones 1, 2 in the lower portion. It ensures a continuity between the first and second contact zones 1, 2, and possibly a continuity with the waveguide 301.

Figure 4:
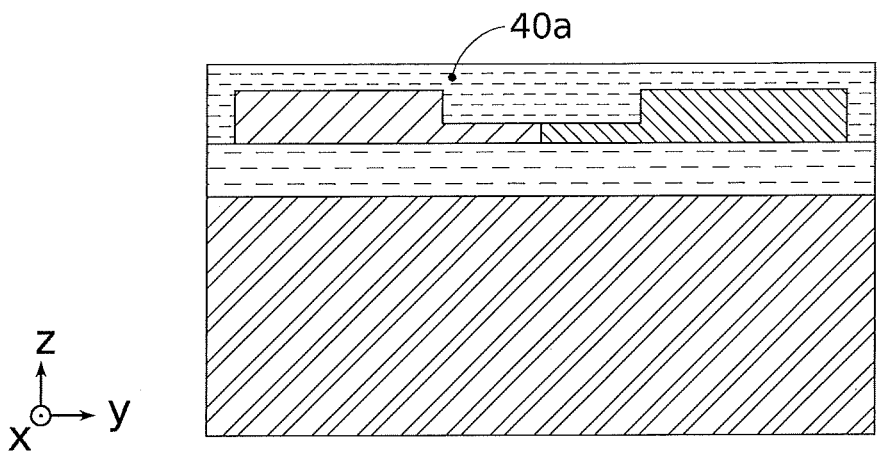

An encapsulation step is then carried out so as to cover the first and second patterns 300, 301 by an encapsulation layer 40*a*, and in particular so as to cover the bottom and the Si-based edges of the first opening (FIG. 4). The encapsulation layer 40*a* can fill the first opening.

The encapsulation layer 40*a* can be deposited by a chemical vapour deposition (CVD) method. The encapsulation layer 40*a* preferably has a thickness of between 100 nm and 300 nm. It can be an oxide layer, for example a silicon dioxide layer.

A Chemical-Mechanical Polishing (CMP) can be carried out so as to planarise the encapsulation layer 40*a* to obtain a flat surface in a plane xy. This CMP is configured to leave an encapsulation layer 40*a* thickness of between 50 nm and 200 nm, so as to protect the first and second patterns 300, 301 in particular during following etching steps.

Figure 5:
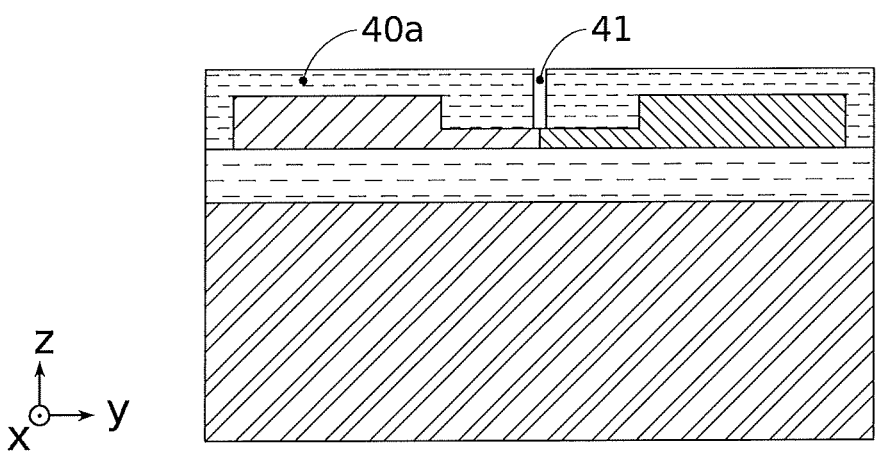

After encapsulation and possibly after CMP, one or more of the openings 41 are formed through the encapsulation layer 40*a* according to the whole of the thickness thereof so as to expose zones of the sacrificial layer 30 (FIG. 5). These openings 41 can be formed from conventional lithography/etching steps. The openings 41 preferably have a circular cross-section having a diameter of between 50 nm and 200 nm, preferably of around 100 nm. More generally, the greatest dimension in the cross-section in the plane xy of the openings 41 is preferably less than or equal to 200 nm and/or greater than or equal to 50 nm.

These openings 41 are preferably located at a distance d along y of the first contact zone 1 and/or of the second contact zone 2, such that 0.6 μm<d≤1.5 μm and preferably d≈1.5 μm. This makes it possible to extend the openings 41 of the first contact zone 1 and/or of the second contact zone 2. The openings indeed constitute singularities which can cause certain variations during following steps of the method, in particular during the lateral epitaxy of GeSn in the cavity 42 formed by the at least partial removal of the sacrificial layer 30. Subsequently, it is advantageous to form the openings 41 as far as possible from the first contact zone 1 and/or from the second contact zone 2 and/or from the active zone A, such that the passage of the electric charges and/or of the light flow is not impeded by the singularities formed by these openings 41.

The openings 41 are preferably regularly spaced together along x, for example by a distance D≤2d.

Figure 6:
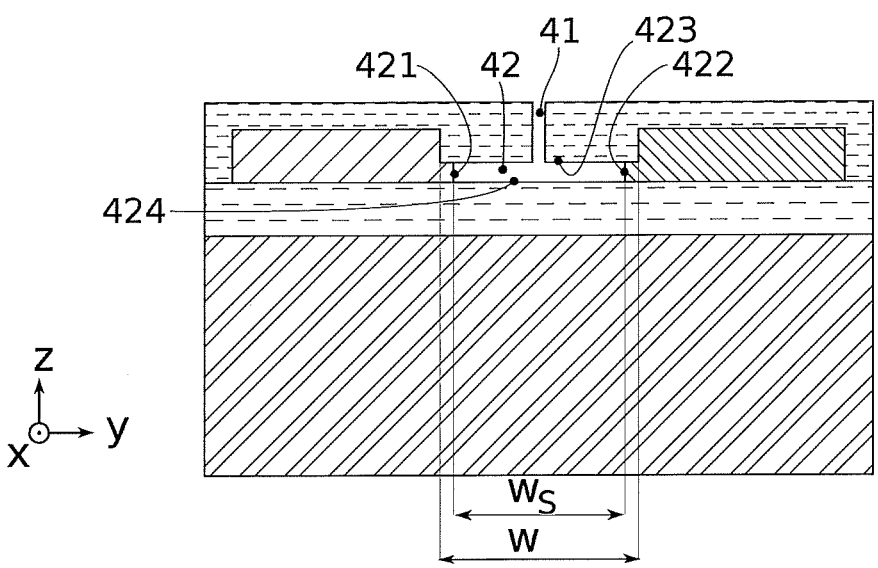

After opening of the encapsulation layer 40*a*, a step of etching the sacrificial layer 30 selectively with silicon dioxide ($SiO_2$) of the encapsulation layer 40*a* and of the BOX 12 is achieved through the openings 41, so as to form air cells, underlying the openings 41 (FIG. 6).

An air cell corresponds to an opening 41 at least at the start of the etching. The air cells are preferably centred on the corresponding openings 41. The air cells advantageously preserve the material of the sacrificial layer 30 at least on the edges along x.

These air cells can advantageously have a coverage together so as to form the cavity 42 at the end of etching.

This cavity 42 can therefore possibly come from several aggregated air cells.

The positioning of the openings 41 is selected such that the cavity 42 coming from the air cells underlying said openings 41 preferably has a rectangular cross-section in the plane xy after etching.

The cavity 42 comprises a lower wall formed by the $SiO_2$ lower face 424 of the BOX 12. It comprises an upper wall formed by the $SiO_2$ face 423 of the encapsulation layer 40*a*. It further comprises a first lateral germination face 421 and a second lateral germination face 422.

The cavity 42 preferably has a width ws between the first and second lateral germination faces 421, 422 of around 3 μm, a length of between 10 μm and 20 μm according to the number of openings 41 and a height between the lower and upper walls equal to the height of the sacrificial layer 30.

The width ws of the cavity 42 can be less than the width w of the first opening, so as to form a first step 31 between the BOX 12 and the first contact zone 1, and a second step 32 between the BOX 12 and the second contact zone 2.

The length of the cavity 42 can be less than the length of the first opening, so as to form a third step between the BOX 12 and the waveguide 301.

According to an advantageous possibility, a thin oxide layer 320, such as illustrated as a top view in FIG. 15, is formed between the taper 302 or the waveguide 301, and the active zone A, prior to the formation of the cavity 42.

It can be formed from etching and/or lithography, and deposition methods conventionally implemented.

It preferably has a dimension along x of between 10 nm and 100 nm.

It advantageously makes it possible to form the cavity 42 without forming the third step described above. The cavity 42 subsequently extends along x to this layer 320. The layer 320 can thus form a wall along a plane yz of the cavity 42.

The cavity 42 is preferably centred with respect to the first opening, at least along y, so as to obtain first and second steps 31, 32 having an identical width.

In particular, the first opening can have a width w=3.2 μm, the cavity 42 can have a width ws of between 3 and 3.18 μm, and the first, second and third steps 31, 32 can have a width greater than or equal to 10 nm and/or less than or equal to 100 nm.

The etching here is configured to produce air cells and, subsequently, the cavity 42 of controlled shape and orientation.

Along z, the air cells advantageously extend over the whole height of the sacrificial layer 30, between a lower face 424 formed by an exposed portion of the BOX 12 and an upper face 423 formed by an exposed portion of the encapsulation layer 40a.

Along x and y, the air cells preferably extend along a substantially square cross-section in the plane xy, the sides of the square being aligned along x and y.

In the case of etching the sacrificial Si layer 30, and more generally for materials having a crystallographic structure of faces centred cubic type or zinc blende, such a square shape can be advantageously obtained by an anisotropic etching.

Such an anisotropic etching is, in particular, quicker in the densest planes of the crystal.

According to an embodiment, the dry or wet etching is configured to obtain an etching rate in the crystallographic directions [110] and [1-10], greater than at least 25%, and preferably at least 35%, than the etching rate in the directions [010] and [100].

The directions of the greatest rates will define the diagonals of a square, close to the embodiment tolerances. Due to this, the sides of the square are oriented along the crystallographic direction [100] or perpendicularly to this direction.

The sides of each air cell along x and y extend therefore preferably respectively along the crystallographic directions [100] and [010].

In the case of etching the sacrificial Si layer 30, a chemical etching using a hydrochloric HCl acid vapour flow at a temperature less than 850° C., and preferably less than 820° C. can be advantageously implemented. The pressure in the etching chamber can be of between 10 Torr and the atmospheric pressure, and preferably equal to 80 Torr. The HCl flow delivered can be of between 1 slm and 25 slm (standard litres per minute), and preferably 15 slm. An $H_2$ flow can also be added, for example between a few 1 slm and 40 slm, preferably 20 slm.

These etching conditions preferably make it possible to limit the etching regime by surface reaction, so as to produce an anisotropic etching of the sacrificial Si layer 30.

According to another possibility, the etching is a wet etching through the openings 41. In the case of etching the sacrificial Si layer 30, a preferably aqueous solution and comprising potassium hydroxide can be used. The wet etching, applied to a confined space, makes it possible to obtain different etching rates along crystallographic directions.

During the etching, the first and second lateral walls substantially parallel to the plane zx of each of the air cells progress respectively in the direction of the first and second contact zones 1, 2, while the third and/or fourth lateral walls substantially parallel to the plane zy of two adjacent air cells progress towards one another.

The etching time is preferably selected such that the air cells coming from each opening 41 are joined together so as to form the cavity 42 at the end of etching.

The cavity 42 at the end of etching can thus have a rectangular shape by the joining of square-shaped air cells along the direction x.

The etching is preferably configured such that the first and second lateral germination faces 421, 422 along zx of the cavity 42 respectively form the counter-steps of the first and second steps 31, 32 of the first and second contact zones 1, 2.

According to an alternative possibility, the etching can be stopped when the first and second lateral germination faces 421, 422 along zx of the cavity 42 are located substantially just under the first and second lateral faces 411, 412 along zx of the first opening, i.e. for a width ws substantially equal to the width w.

Figure 7:
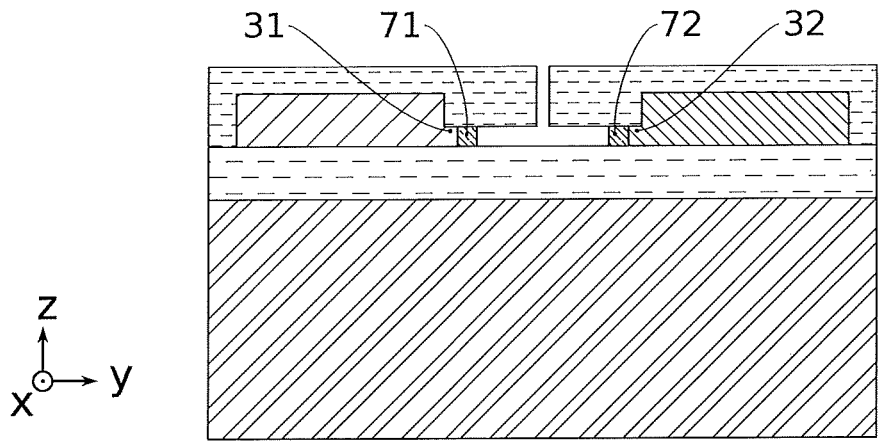

The cavity 42 is then partially filled by a first lateral epitaxy of germanium, preferably Ge-i, so as to form the germination layer(s) 71, 72 (FIG. 7).

Germanium is advantageously epitaxially grown on the lateral silicon-based germination walls 421, 422 of the cavity 42 by a first lateral epitaxial growth.

This first growth by lateral epitaxy is guided by the lower and upper $SiO_2$-based walls of the cavity 42.

It can be guided by at least one $SiO_2$-based wall along yz of the cavity 42. Such a wall corresponds, for example, to the exposed portion of the thin oxide layer 320 after formation of the cavity 42.

The growth front coming from the first lateral germination wall 421 is therefore propagated along y in the direction of the second contact zone 2 in a well-controlled manner. Similarly, the growth front coming from the second lateral germination wall 422 is propagated along y in the direction of the first contact zone 1 in a well-controlled manner.

The first lateral Ge growth is preferably achieved from a chemistry based on a $GeH_4$ germane precursor in the gaseous phase. An addition of hydrochloric HCl acid in the gaseous phase can advantageously make it possible to avoid an excess clogging of the walls of the chamber of the epitaxy structure during the epitaxy.

This lateral germanium epitaxy is preferably achieved at a "low" temperature of around 400° C. and at a pressure of around 100 Torr for a duration of a few minutes. Such a "low" temperature makes it possible to limit the appearance of epitaxy defects in the germination layer 71, 72.

According to a possibility, the lateral germanium epitaxy can be achieved in two steps, first at the "low" temperature, then at a "high" temperature of around 600° C. to 700° C. and at a pressure of around 20 Torr. Such a "high" temperature makes it possible to benefit from increased growth speeds. Such a "high" temperature also makes it possible to distribute more evenly the dislocations present within the epitaxially grown germanium thanks to a greater mobility of said dislocations, and to potentially minimise the density thereof by recombination/annihilation of dislocations.

The germination layer(s) 71, 72 thus formed have a thickness equal to the residual thickness e, of between 10 nm and 50 nm.

Such a thickness makes it possible to limit the appearance of structural defects in this Ge-i germination layer 71, 72.

FIG. 19 shows a Ge-i layer laterally coupled with an Si layer. This Ge-i layer has a thickness of 16 nm, and has been obtained by lateral epitaxy between two oxide layers forming the lower and upper walls according to the invention.

The Ge-i layer thus obtained has no structural defects. In particular, it has no dislocations, in particular threading dislocations.

Moreover, the interface between the Si layer and the Ge-i layer is flat and well-defined.

The first lateral Ge growth is configured to obtain one or more germination layers 71, 72 having a width greater than or equal to 10 nm and/or less than or equal to 100 nm.

From this first lateral growth, the cavity 42 comprises the lower wall formed by the lower $SiO_2$ face 424 of the BOX 12, the upper wall formed by the $SiO_2$ face 423 of the encapsulation layer 40a, a first lateral base face 431 and a second lateral base face 432 (FIG. 7).

Figure 8:
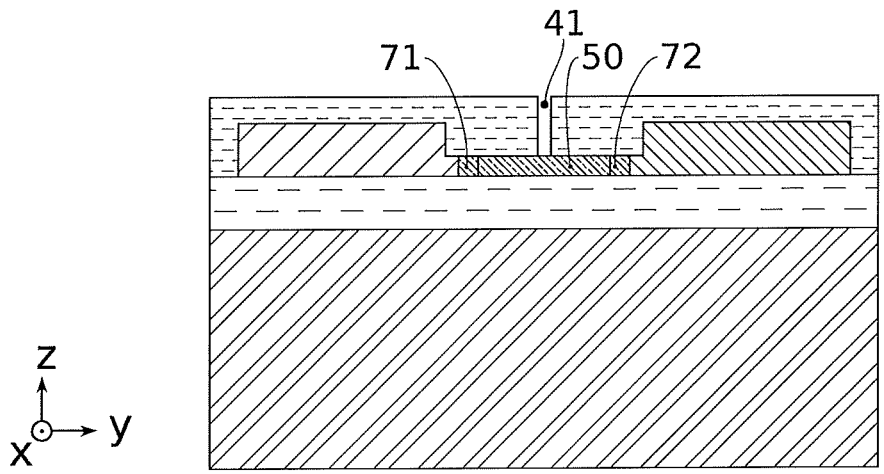

The cavity 42 is then totally filled by a second lateral germanium-tin epitaxy, preferably GeSn-i, so as to form the base layer 50 (FIG. 8).

The germanium-tin alloy is advantageously epitaxially grown on the germanium-based lateral base walls 431, 432 of the cavity 42 by a second lateral epitaxial growth.

The Ge-i germination layers 71, 72 with no structural defects (in particular of dislocations, in particular threading dislocations) advantageously form germs for this second lateral growth.

The crystalline quality of this GeSn base layer 50 can thus be optimised.

This second lateral GeSn epitaxy is preferably achieved at a temperature of between 300° C. and 400° C. Such a temperature makes it possible to limit the appearance of epitaxy defects in the base layer 50.

This second lateral GeSn epitaxy is preferably achieved from a chemistry based on $GeH_4$ or $Ge_2H_6$ and $SnCl_4$ precursors in the gaseous phase. These precursors are preferably diluted in dihydrogen $H_2$, for flow ratios $F(Ge_2H_6)/F(H_2)=7.92\times10^{-4}$ and $F(SnCl_4)/F(H_2)=4.12\times10^{-5}$ for example.

This second lateral GeSn epitaxy can be achieved for a pressure of between 20 Torr and 100 Torr.

This second growth by lateral epitaxy is guided by the lower and upper $SiO_2$-based walls of the cavity 42.

This second lateral growth is therefore configured to form the base layer 50 having a thickness equal to the residual thickness e, of between 10 nm and 50 nm.

Such a thickness makes it possible to limit the appearance of structural defects in the GeSn base layer 50. In particular, the growth can be pseudomorph, i.e. the epitaxy stresses (linked in particular to the difference of mesh parameters between Ge and GeSn) can be elastically relaxed during growth.

The compressed residual stress in this GeSn base layer 50 can thus be decreased.

Advantageously, such a GeSn base layer 50 can have a tin concentration of between 8% and 12%, for example of around 10%.

The GeSn growth front coming from the first Ge lateral base wall 431 is propagated therefore along y in the direction of the second contact zone 2 in a well-controlled manner. Similarly, the GeSn growth front coming from the second Ge lateral base wall 432 is propagated along y in the direction of the first contact zone 1 in a well-controlled manner.

These GeSn growth fronts are joined in a median zone substantially just under the openings 41. This median zone can have structural defects. In the following, the active zone of the light source is therefore advantageously offset with respect to this median zone.

The GeSn lateral epitaxy is continued until the GeSn covers the whole $SiO_2$ lower face 424 of the BOX 12.

It can be continued until the GeSn at least partially fills the openings 41.

The base layer 50 thus formed ensures an electric continuity between the first and second contact zones 1, 2 and/or between the first and second steps 31, 32.

Figure 9:
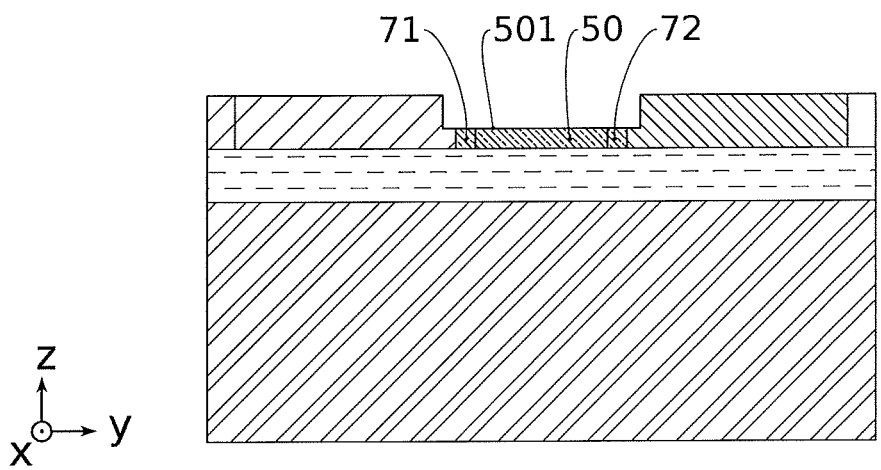

The encapsulation layer 40a is then removed, at least partially, so as to expose the upper face 501 of the base layer 50 (FIG. 9). A wet etching of the $SiO_2$ selectively with Si, Ge and GeSn can be implemented so as to remove this encapsulation layer 40a.

Such an etching, for example made from a hydrofluoric HF acid solution, is known to a person skilled in the art.

Optionally, a planarisation step comprising, for example, an anisotropic etching of the base layer 50 can be carried out so as to remove an excrescence of the GeSn at the level of the openings 41 and/or of the median zone.

This planarisation step is configured so as to improve the flatness of the upper face 501 of the base layer 50.

Another surface preparation step, for example a cleaning, of the upper face 501, can also be carried out, prior to the vertical epitaxial growth of GeSn.

Figure 10:
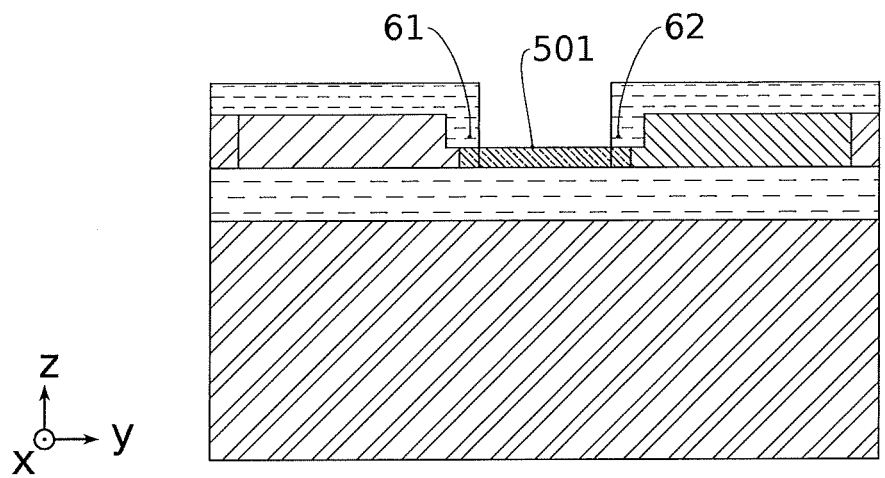

A step of masking the Si-based faces can advantageously be carried out, so as to only expose the upper face 501 of the GeSn base layer 50 (FIG. 10).

The first and second contact zones 1, 2, the edges of the first opening, the first, second and third steps 31, 32, and/or the germination layers 71, 72 can thus be covered by a dielectric material layer, for example, $SiO_2$ or a low stressed silicon nitride (SiN).

$SiO_2$ or SiN lateral layers 61, 62 are thus advantageously formed.

The first lateral layer 61 covering the first lateral face 411 can have a width w1 of between 10 nm and 100 nm.

The second lateral layer 62 covering the second lateral face 412 can have a width w2 of between 10 nm and 100 nm.

A third lateral layer covering the outlet face of the taper 302 or of the waveguide 301 can have a dimension along x of between 10 nm and 100 nm. It can rest on the third step. It can alternatively correspond to the thin oxide layer 320.

Figure 11:
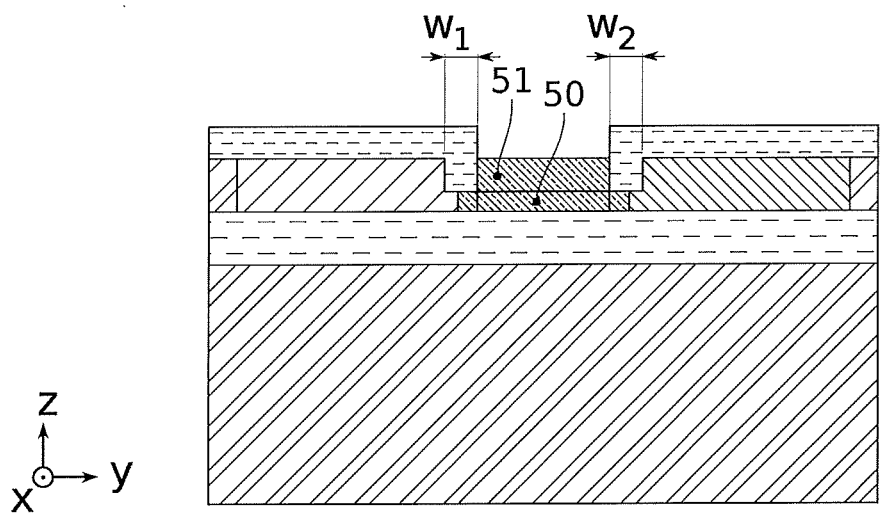

These first, second and third lateral layers 61, 62 advantageously make it possible to guide the vertical epitaxial growth of GeSn (FIG. 11).

The first and second lateral layers 61, 62 furthermore make it possible to improve the optical confinement of a light wave in the active zone A. These first and second lateral layers 61, 62 resting on the first and second steps 31, 32 and/or on the germination layers 71, 72 both induce an optical confinement by contrast of refractive indices, and a geometric optical confinement.

In particular, first and second $SiO_2$ lateral layers 61, 62 have a great refractive index difference with GeSn of the active zone A. This increases the optical confinement called by contrast of indices.

The germination layers 71, 72 form, in the plane zy, an "inverted T" or "rib" through profile. This can favour the geometric optical confinement.

The third lateral layer is preferably configured to optimise the optical coupling between the taper 302 or the waveguide 301 and the GeSn of the active zone A, i.e. to optimise the transmission of a light wave being propagated from the active zone A to the waveguide 301 according to a given optical mode.

In particular, for a dimension along x less than or equal to 20 nm, a third $SiO_2$ lateral layer makes it possible to transmit a Gaussian mode of a light wave having a wavelength of between 1.6 μm and 4 μm, for example of around 2.5 μm or 3 μm, almost without any optical losses. For a dimension along x greater than or equal to 40 nm, a third, not very stressed SiN lateral layer, having a refractive index greater than $SiO_2$, makes it possible to limit the optical losses in the transmission of a Gaussian mode of a light wave having such a wavelength.

The growth by vertical epitaxy of the GeSn is achieved from the upper face 501 of the GeSn base layer 50. This base layer 50 therefore forms a germ for the growth of the structural layer 51.

The lateral layers 61, 62 avoid a parasitic growth of GeSn on the edges of the first opening and/or on the Ge germination layers 71, 72.

The growth front coming from this upper face 501 is propagated therefore along z in a well-controlled manner.

The structural layer 51 thus formed has an optimised crystalline quality.

From the vertical epitaxy, the growth front on the upper surface of the structural layer 51.

This upper surface can be located either below a plane comprising the surfaces of the contact zones 1, 2, or substantially in this plane, flush with the surfaces of the contact zones 1, 2, or above this plane, exceeding the surfaces of the contact zones 1, 2.

In the latter case, a subsequent polishing can be carried out to level the surfaces of the contact zones 1, 2 and the upper surface of the structural layer 51. This levelling is however optional.

The vertical epitaxy of the GeSn is preferably achieved at a temperature of between 300° C. and 400° C.

According to a possibility, the vertical epitaxy of the GeSn can be achieved in two steps, first at a temperature of around 300° C., then at a temperature of around 400° C.

This makes it possible to limit the appearance of epitaxy defects in the structural layer 51 at the start of the homoepitaxy, then to benefit from sufficiently high growth speeds, compatible with the formation of a structural layer 51 of great thickness, for example of around 250 nm or more.

The etching of the top Si 11 to form the first opening and the cavity 42, the first and second lateral growths and the vertical growth can advantageously be carried out in one same structure, so as to avoid an oxidation of the lateral germination faces 421, 422, of the lateral base faces 431, 432 and of the upper face 501.

A localised etching of the GeSn at the level of the median zone is then advantageously carried out. It is, in particular, configured to remove some of the structural defects of the GeSn which potentially appear at the end of the second lateral growth.

Figure 12:
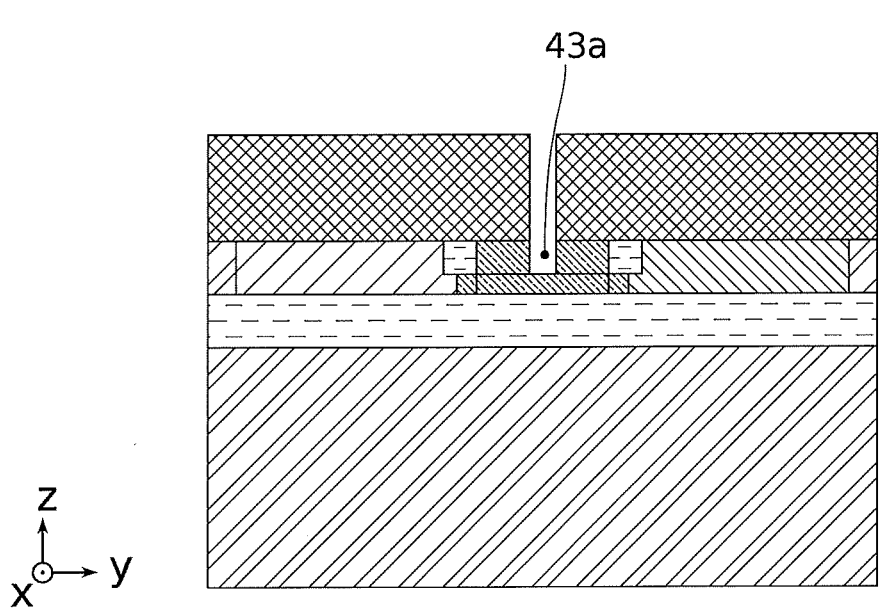

This localised etching makes it possible to form a slot 43a in the structural layer 51 (FIG. 12).

This slot 43a is mainly directed along x and makes it possible to separate a first GeSn section 51 and a second GeSn section 51b.

This slot 43a does not open onto the BOX 12. A strip 52 of GeSn having a thickness of around 50 nm is conserved between the BOX 12 and the slot 43a so as to ensure an electric continuity between the first and second contact zones 1, 2 for the electric injection of carriers in the active zone A.

Figure 13:
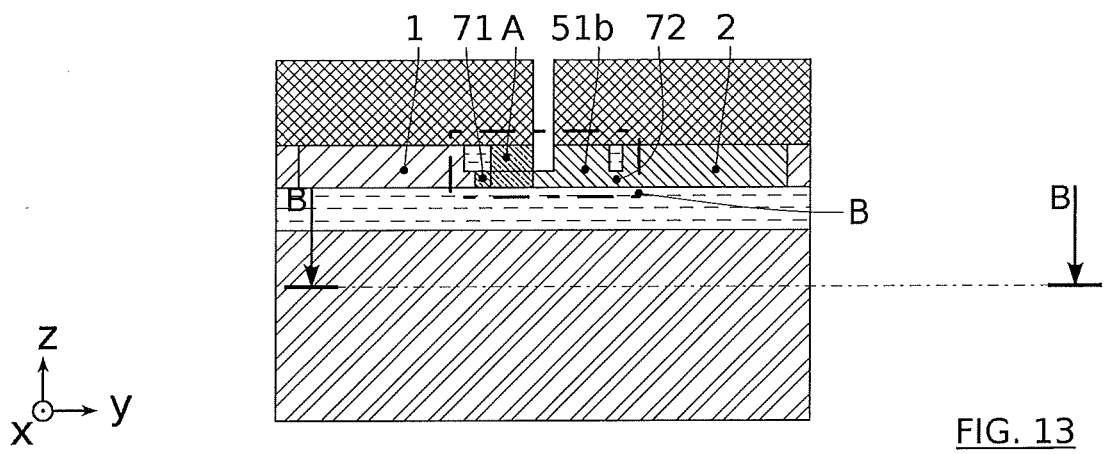
Figure 14:
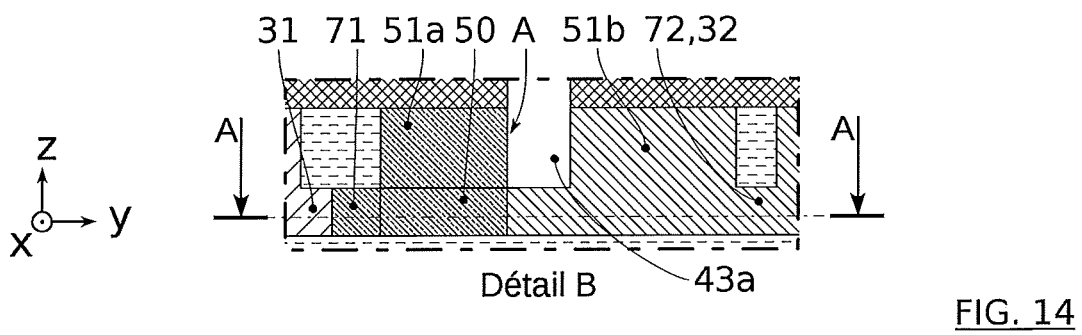

At least one implantation is preferably carried out at the level of the second section 51b, of the strip 52, and of the germination layer 72 so as to dope them with n+ type. The GeSn can be n+ doped effectively with phosphorus. Such a doping is, for example, described in the document, "S. Prucnal et al. 2018, Semicond. Sci. Technol., 33 (2018) 065008". This doping, possibly carried out by several implantations, aims to obtain a continuous n+ type zone between the second contact zone 2 and the first section 51a forming at least partially the active zone A, such as illustrated in FIGS. 13 and 14. This n+ type zone thus makes it possible to inject carriers from the contact zone 2 to the active zone A.

The electric injection of the carriers in the active zone A is carried out, preferably from the first contact zone 1 by way of the first step 31 and of the germination layer 71, and from the second contact zone 2 by way of the second step 32, of the doped germination layer 72, of the doped second section 51b and the doped strip 52 (FIGS. 14 and 15).

The first and second steps 31, 32 of this light source constitute carrier injection zones. To compensate for a low thickness of these carrier injection zones, the doping of the first and second steps 31, 32 can be increased, for example by a step of implanting a higher dose after having exposed the sacrificial layer 30. A dose greater than or equal to $5.10^{19}$ cm$^{-3}$ can suit.

In order to form an optical cavity for the laser amplification at the level of the active zone A, the slot 43a is preferably filled by a dielectric material, preferably $SiO_2$.

A chemical-mechanical polishing (CMP) is preferably carried out in order to expose the upper face of the active zone A.

Figure 16:
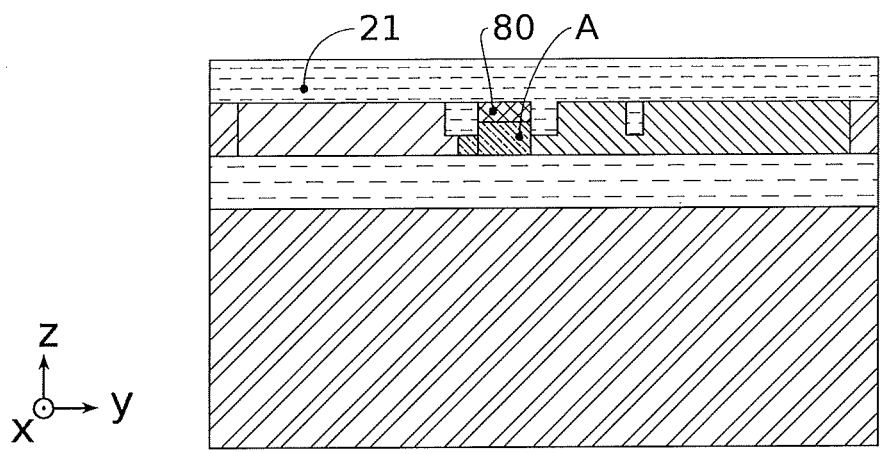

Distributed Bragg Reflectors (DBR) 80 can then be formed on the upper face of the active zone A (FIG. 16).

This distributed Bragg reflectors 80 DBR make it possible, advantageously, to confine the optical emission mode(s) in the active zone A. An optical cavity is thus advantageously formed. This optical cavity can be resonating at the emission wavelength of the laser. In a manner known per se, the distributed Bragg reflectors 80 can be completed or replaced by distributed feedback (DFB) structures 80.

The optical cavity can be formed according to other architectures, for example of cube corner, Fabry-Perot type.

The advantages linked to these different structures or architectures are known to a person skilled in the art. The architecture of the optical cavity can subsequently be selected according to these advantages (single-mode functioning, tuneable laser, high injection current for the electric pumping, etc.).

Figure 18:
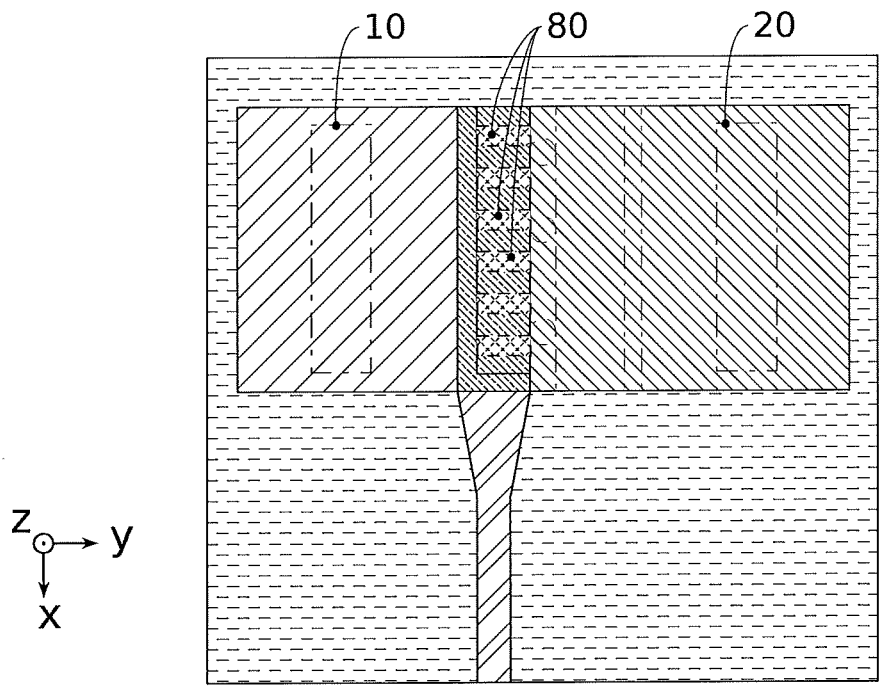

An encapsulation layer 21, preferably made of $SiO_2$, is then formed so as to cover the DBRs 80 and/or the contact zones 1, 2, as illustrated in FIGS. 16 and 18.

The following steps can be conventional steps of forming metal contacts, comprising, in particular, the formation of through vias at the level of the first and second contact zones 1, 2, the deposition of the metal contacts 10, 20 in the vias (FIG. 17) and possible rapid thermal annealing (for example, of the RTA type, or of the "flash lamp" type, or "laser annealing" type) to activate the contacts 10, 20.

Figure 17:
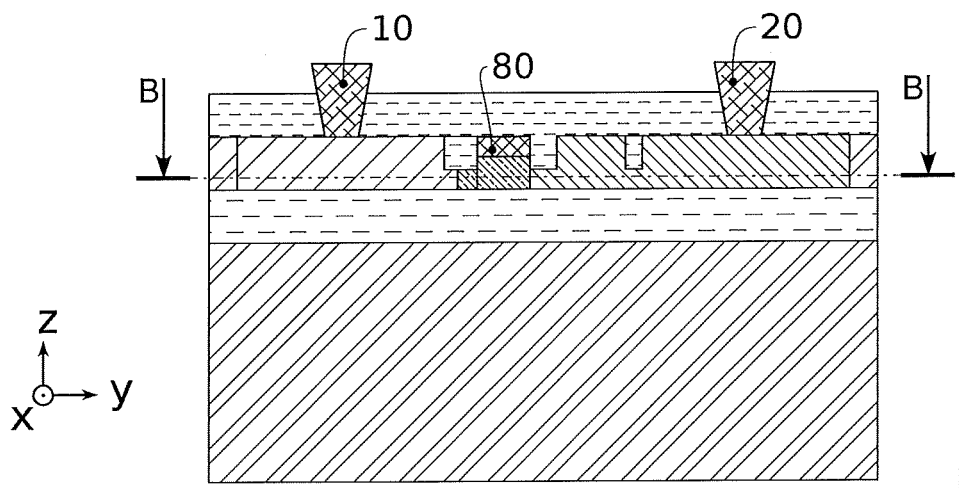

A GeSn laser source with lateral injection is thus advantageously obtained (FIGS. 17 and 18).

Figure 20:
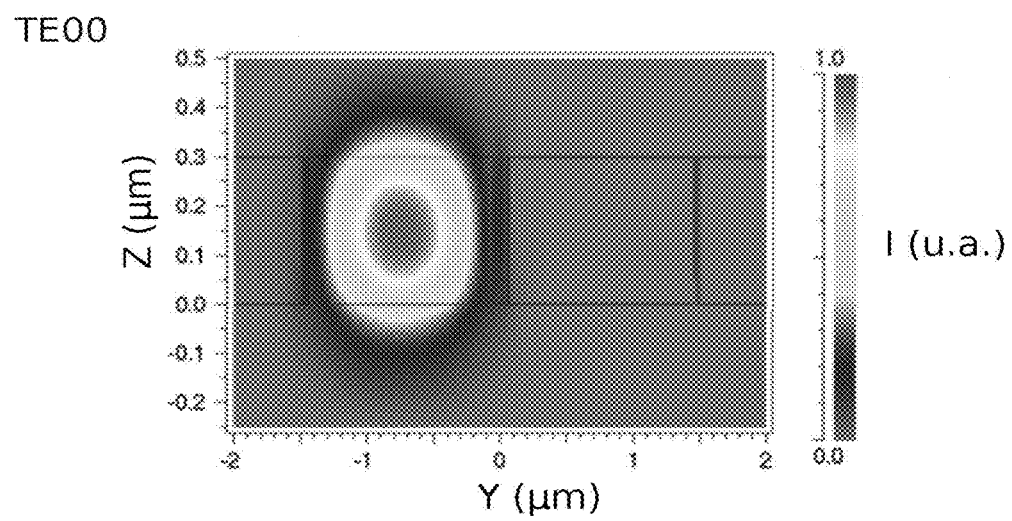
FIG. 20 shows a simulation result in a transversal cross-section of an optical mode for propagating the light flow in the active zone of a light source according to the first embodiment of the present invention; the light intensity (arb. units) of this optical mode TE00 decreases from the centre (grey zone corresponding to the grey zone in the immediate proximity of the value 1 of the intensity scale in arbitrary units (arb. units) of the lobe of the optical mode towards the periphery (black zone corresponding to the black zone in the immediate proximity of the value 0 of the intensity scale in arbitrary units (arb. units)) of the lobe of the optical mode.

Such a laser source makes it possible in particular to emit a light flux being propagated mainly along x according to a fundamental optical mode TE00, such as illustrated in FIG. 20 by the result of simulations obtained for this source.

Other embodiments are described below.

Only the features of these embodiments separate from the first embodiment are described below, the other features, not described, being considered identical to those of the first embodiment described above in reference to FIGS. 1 to 18. In particular, another embodiment of the invention is a light source with lateral injection, for example a laser source or an indium phosphorus InP-based LED. In this case, the GeSn of the active zone A (base layer 50+structural layer 51) is replaced by the InP (FIG. 11). The active zone A of this relaxed InP-based light source advantageously has an improved emission efficiency. The following embodiments can also alternatively comprise InP instead of GeSn.

Figure 21:
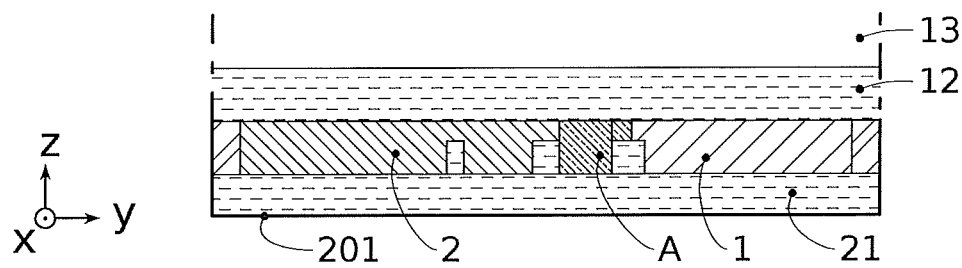
FIGS. 21 to 23 illustrate steps of producing a light source according to a second embodiment of the present invention.

A second embodiment of the method according to the invention will now be described in reference to FIGS. 21 to 23.

The light source obtained by this second embodiment is a GeSn laser source coming from a first substrate 101 and returned on a second substrate 102.

The first steps of this second embodiment are common with those of the first embodiment illustrated in FIGS. 1 to

16. They mainly consist of forming the first and second contact zones 1, 2, defining the first pattern 300 and preferably only the first pattern 300, forming the GeSn active zone and the DBRs 80, and encapsulating it all by the encapsulation layer 21 (FIG. 21).

These steps are preferably carried out according to the same conditions as those described above in the first embodiment of the invention.

The encapsulation layer 21 is an oxide layer. This oxide layer 21 preferably has a uniform thickness, of between a few tens of nanometres and a few hundred nanometres, and a free face 201.

The second substrate 102 can, for example, be a silicon substrate 23, possibly comprising optoelectronic or microelectronic devices on a face called active face. This second substrate 102 can also comprise materials III-V and/or on silicon photonic-type devices on the active face thereof.

The second substrate 102 can, in particular, comprise a rib waveguide 303, preferably made of silicon, insulated in a dielectric material layer 22, preferably $SiO_2$.

Figure 22:
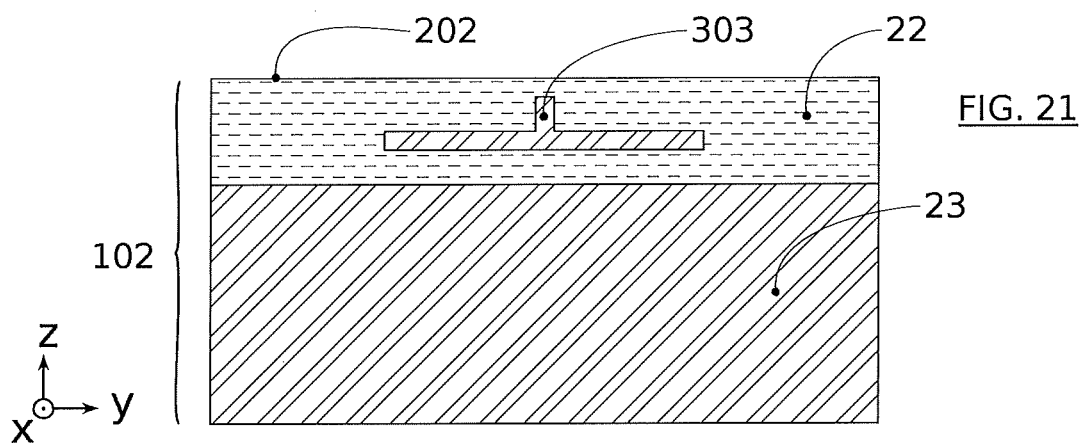

The waveguide 303 is located preferably within this layer 22 (FIG. 22).

This oxide layer 22 can have a thickness of between a few hundred nanometres and a few microns.

The sum of the thicknesses of the oxide layer 21 and of the oxide layer 22 is preferably of between 800 nm and 2800 nm.

The oxide layer 22 has a free face 202.

The rib waveguide 303 preferably has a protruding edge rotated towards the free face 202, at a distance of between 10 nm and 500 nm of said free face 202.

A direct bonding between the first and second substrates 101, 102 is preferably achieved.

A step of preparing the surface of the free faces 201, 202 of the first and second substrates 101, 102, comprising, for example, a cleaning and a hydrolysis, is preferably carried out. The cleaning can be carried out, for example, in an ozone-enriched deionised water bath. The hydrolysis can be carried out, for example, in an ammonium peroxide mixture (APM) at 70° C.

After preparing the surfaces, the free face 201 of the oxide 21 of the first substrate 101 is put into contact with the free face 202 of the oxide 22 of the second substrate 102, at ambient temperature and pressure.

The edge of the rib waveguide 303 is preferably oriented along x and aligned with the active zone A. It can be centred along y on the active zone A, or offset by a few hundred nanometres with respect to the centre of the active zone A. The distance along z separating the active zone A and the edge of the waveguide 303 can be of between 50 nm and 300 nm, so as to form an evanescent coupling between the waveguide 303 and the active zone A.

According to a possibility, the waveguide 303 can be structured over all or some of the length thereof to respective produce a DFB optical cavity or a DBR optical cavity around the active zone A.

The structuring of the waveguide 303 advantageously makes it possible to avoid a structuring of the active zone A to form the optical cavity. The GeSn surfaces of the active zone A are thus preserved. The optical surface losses by non-radiative recombinations are thus limited.

Figure 23:
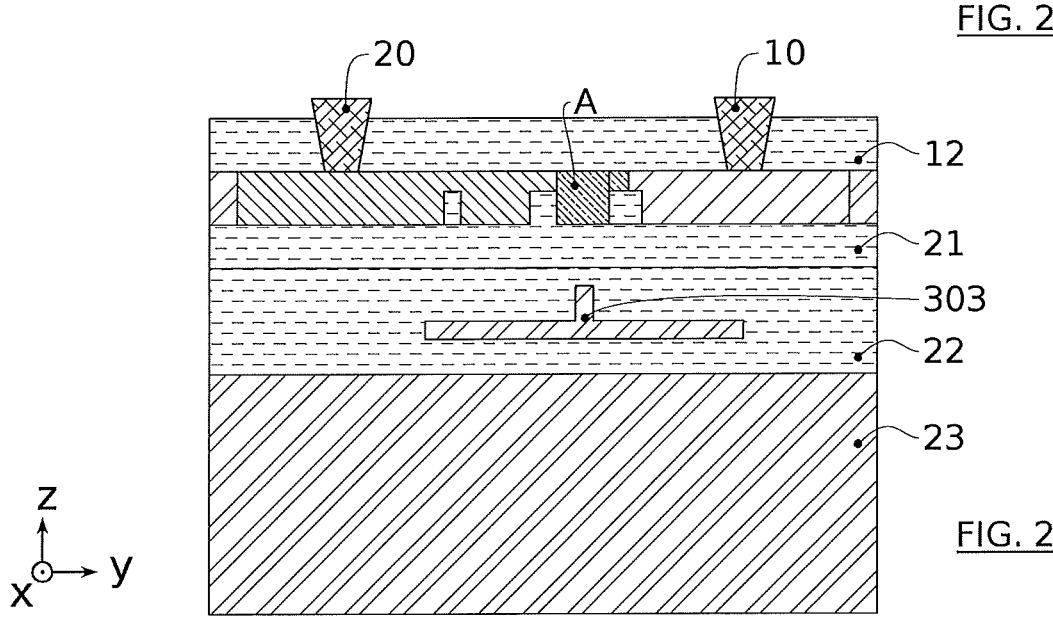

An annealing at 400° C. for two hours can then be carried out so as to finalise the direct bonding by molecular adhesion between the oxides 21, 22 (FIG. 23).

This second embodiment makes it possible to partially insulate the laser source from the guiding structure (the waveguide 303).

The bulk Si 13 of the first substrate 101 can then be removed, for example, by grinding and abrasion on at least 95% of the initial thickness thereof then by selective etching in a tetramethylammonium hydroxide (TMAH)-based or potassium hydroxide (KOH)-based solution, so as to expose the BOX 12. Such an etching can have an $Si/SiO_2$ selectivity ratio of around 5000/1.

This possibility makes it possible to obtain, on the surface, an oxide layer of very well-controlled thickness formed by the exposed BOX 12.

Through vias at the level of the first and second contact zones 1, 2 of the GeSn laser source can then be formed, and metal contacts 10, 20 can then be deposited at the level of the vias then activated (FIG. 23).

Advantageously, the metal contacts 10, 20 have metal surfaces flush with the first and second contact zones 1, 2, in a plane defining an upper edge of the active zone A. The transport of charges and/or the optical confinement of such a GeSn laser source with lateral injection can thus be improved. The integration of such a laser source by conventional interconnection technology steps (metal lines and vias in BEOL (Back End Of Line) technologies) is thus facilitated.

Figure 25:
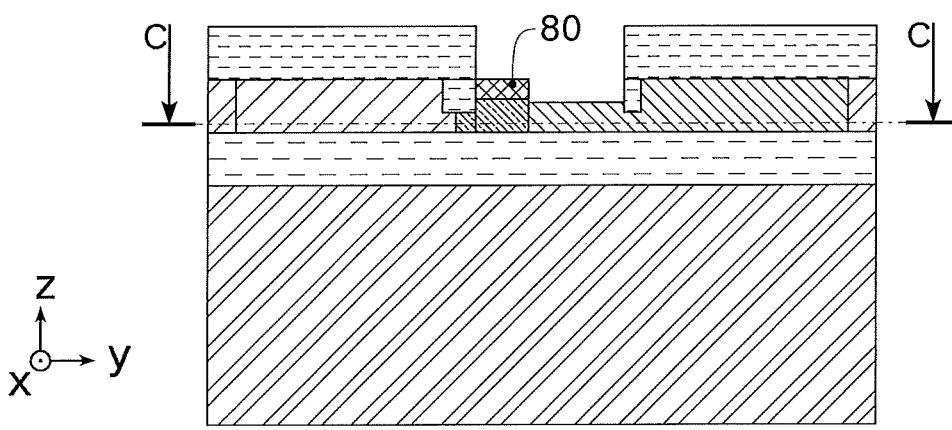
Figure 26:
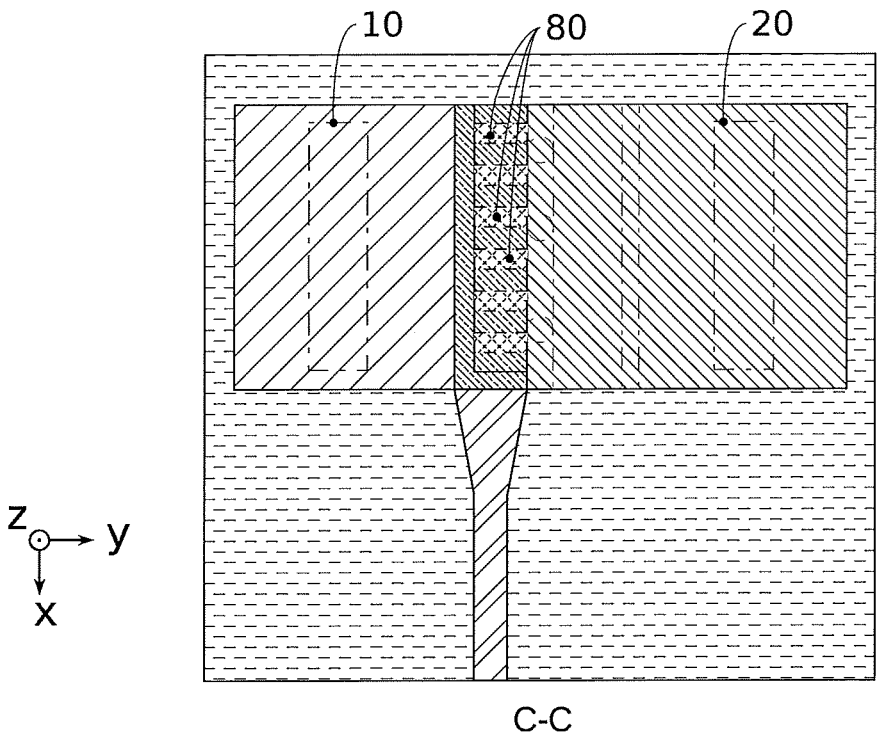

A third embodiment of the method according to the invention will now be described in reference to FIGS. 24 to 26.

The light source obtained by this third embodiment is a GeSn laser source with lateral injection.

The first steps of this second embodiment are steps common with those of the first embodiment illustrated in FIGS. 1 to 11. They mainly consist of forming the first and second contact zones 1, 2, defining the first and second patterns 300, 301, and making the GeSn base 50 and structural 51 layers grow.

These steps are preferably carried out according to the same conditions as those described above in the first embodiment of the invention.

A localised etching of the GeSn on around one half of the width of the structural layer 51 is then advantageously carried out. It is, in particular, configured to remove some of the structural defects of the GeSn which potentially appear at the end of the second lateral growth.

Comparatively to the first embodiment, this localised etching makes it possible to form a slot 43b extended with respect to the slot 43a separating the first and second sections 51a, 51b.

Figure 24:
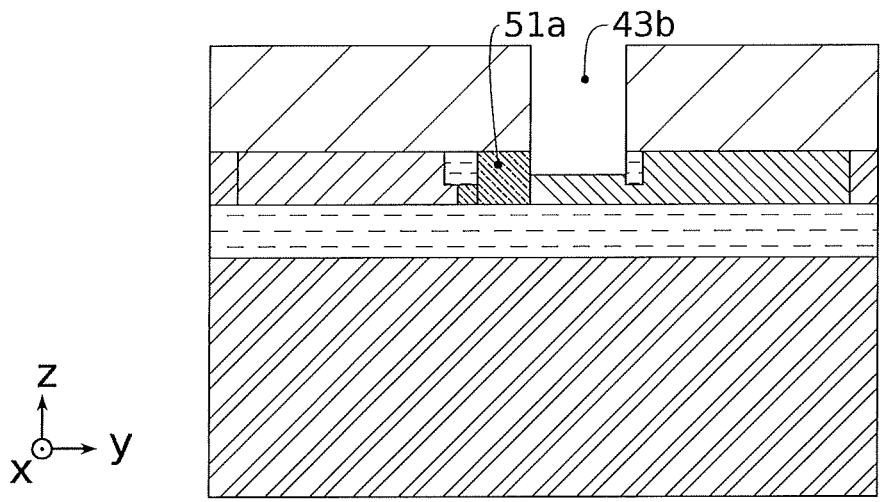
FIGS. 24 to 26 illustrate steps of producing a light source according to a third embodiment of the present invention.

In particular, this slot 43b makes it possible to form the first GeSn section 51a, and to partially remove the second section 51b (FIG. 24).

The etching depth is selected so as to conserve a GeSn strip having a thickness around equal to the thickness of the germination layer, for example of around 50 nm, so as to ensure an electric continuity between the first and second contact zones 1, 2 for the electric injection of the carriers in the active zone A.

At least one implantation is preferably achieved at the level of this strip so as to n+ type dope the GeSn.

The DBRs 80 can then be formed (FIGS. 25 and 26) and the source encapsulated.

The lateral electric injection and/or the lateral optical confinement can thus be improved in this third embodiment.

Figure 27:
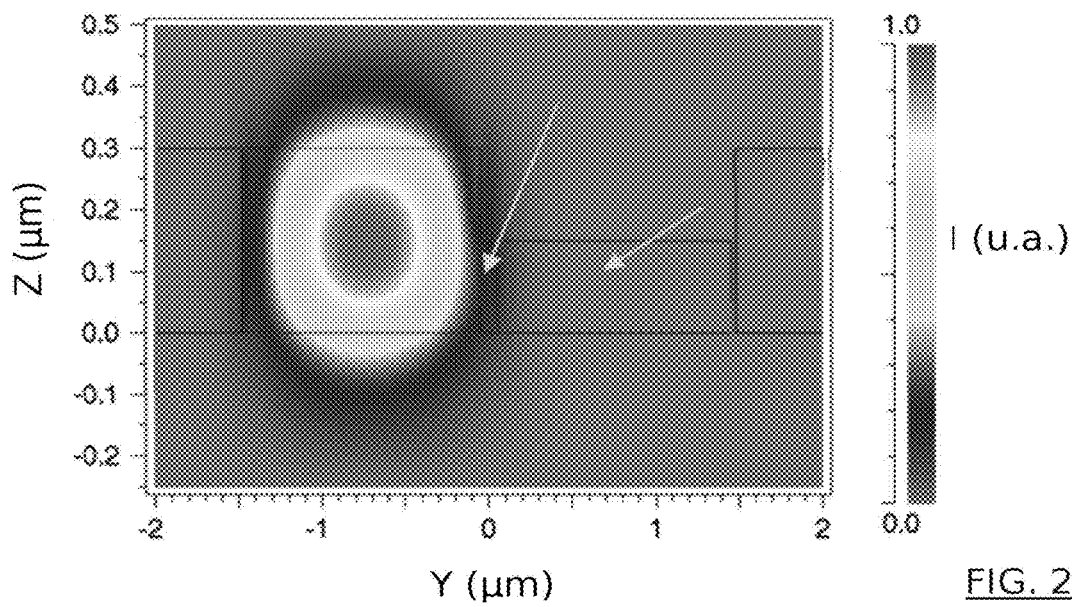
FIG. 27 shows a simulation result in a transversal cross-section of an optical mode for propagating the light flow in the active zone of a light source according to the third embodiment of the present invention; the light intensity (arb. units) of this optical mode TE00 decreases from the centre (grey zone corresponding to the grey zone in the immediate proximity of the value 1 of the intensity scale in arbitrary units (arb. units) of the lobe of the optical mode towards the periphery (black zone corresponding to the black zone in the immediate proximity of the value 0 of the intensity scale in arbitrary units (arb. units)) of the lobe of the optical mode.

In particular, the light flow emitted by this laser source is advantageously confined in the first GeSn section 51a. This advantageously makes it possible to obtain a propagation of the light flow mainly along x according to a fundamental optical mode TE00, such as illustrated in FIG. 27 by the result of simulations obtained for this source.

This fundamental optical mode TE00 is almost Gaussian, and has low optical losses.

Such an optical mode, obtained for example by the laser source according to this third embodiment, can advantageously be used for the optical encoding of information.

Figure 28:
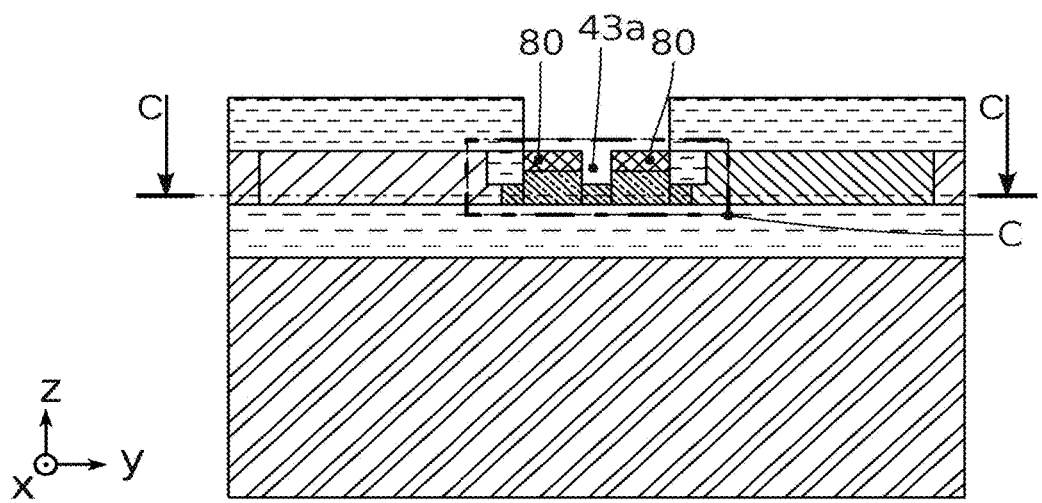
FIGS. 28 to 30 illustrate steps of producing a light source.
Figure 29:
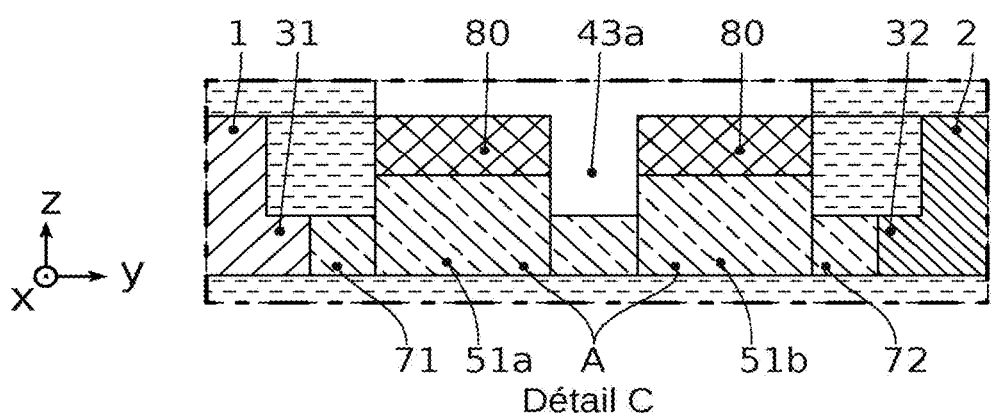
Figure 30:
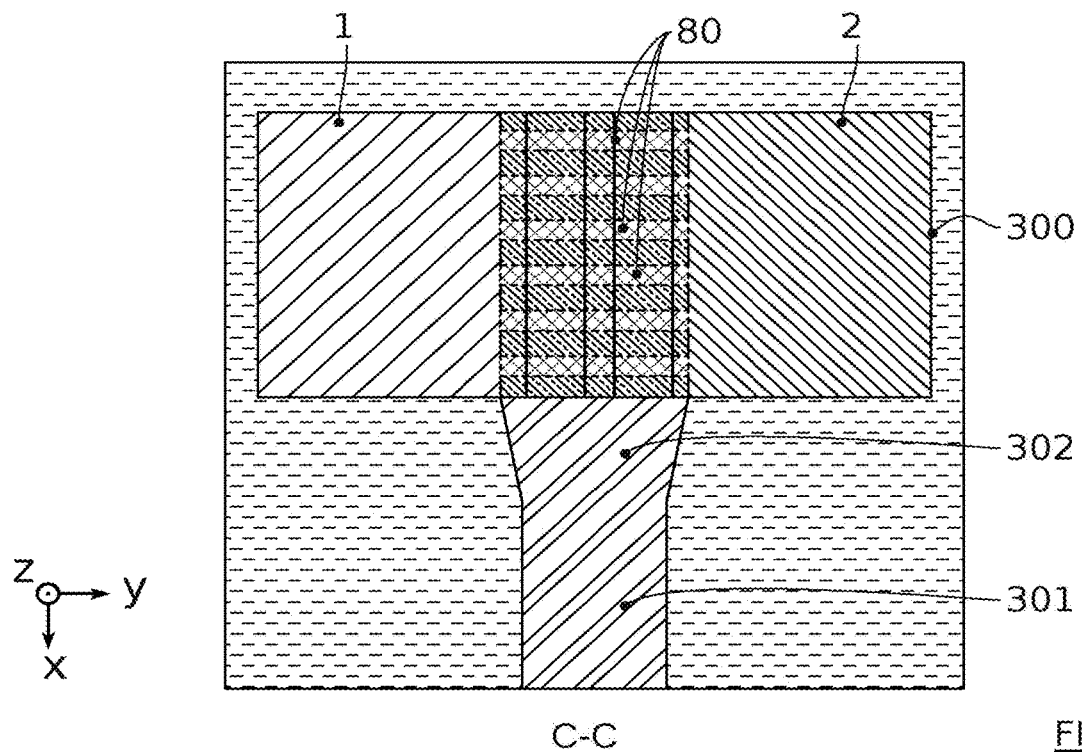

According to a fourth embodiment illustrated by FIGS. 28 to 30, the two sections 51$a$ and 51$b$ of the GeSn active zone A can be conserved so as to produce two optical cavities separated by the slot 43$a$ (FIGS. 28, 29).

In this case, the formation of the DBRs 80 is done in the upper portion of each section 51$a$, 51$b$, such as detailed in FIG. 29.

Figure 31:
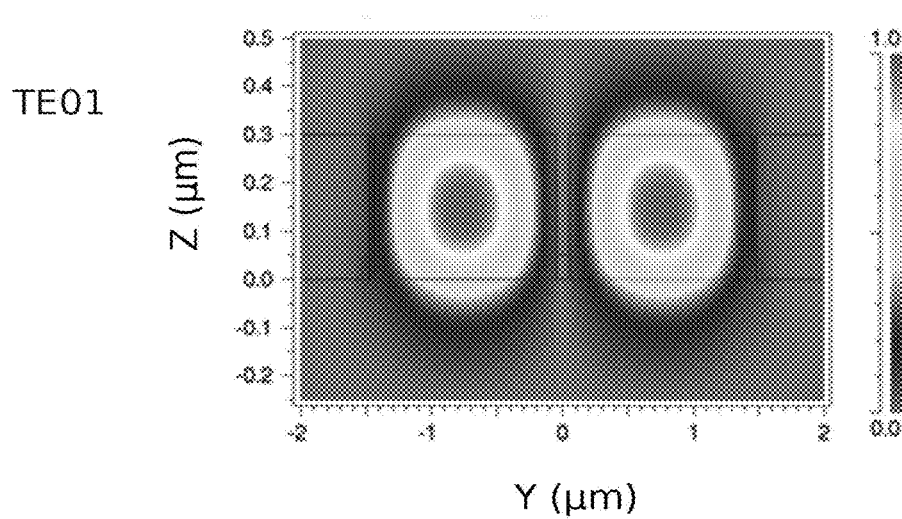
FIG. 31 shows a simulation result in a transversal cross-section of an optical mode for propagating the light flow in the active zone of a light source according to the fourth embodiment of the present invention; the light intensity (arb. units) of this optical mode TE01 decreases from the centre (grey zones corresponding to the grey zone in the immediate proximity of the value 1 of the intensity scale in arbitrary units (arb. units) of each of the lobes of the optical mode towards the periphery (black zones corresponding to the black zone in the immediate proximity of the value 0 of the intensity scale in arbitrary units (arb. units)) of each of the lobes of the optical mode.

Such a laser source subsequently comprises two gain regions in the active zone A. It makes it possible, in particular, to obtain a propagation of the light flow mainly along x according to an optical mode TE01, such as illustrated in FIG. 31 by the result of simulations obtained for this source.

In order to collect the light emitted in the active zone A and to transmit this mode TE01 to the waveguide 301, a taper 302 extended with respect to the preceding embodiments can be defined beforehand, such as illustrated in FIG. 30.

An evanescent coupling, for example with an underlying rib waveguide having two protruding edges, can also be considered.

Such a laser source configured to emit a light flow being propagated according to an optical mode TE01 can be coupled to a mode converter 400, so as to convert this mode TE01 into a mode TE00.

Figure 32:
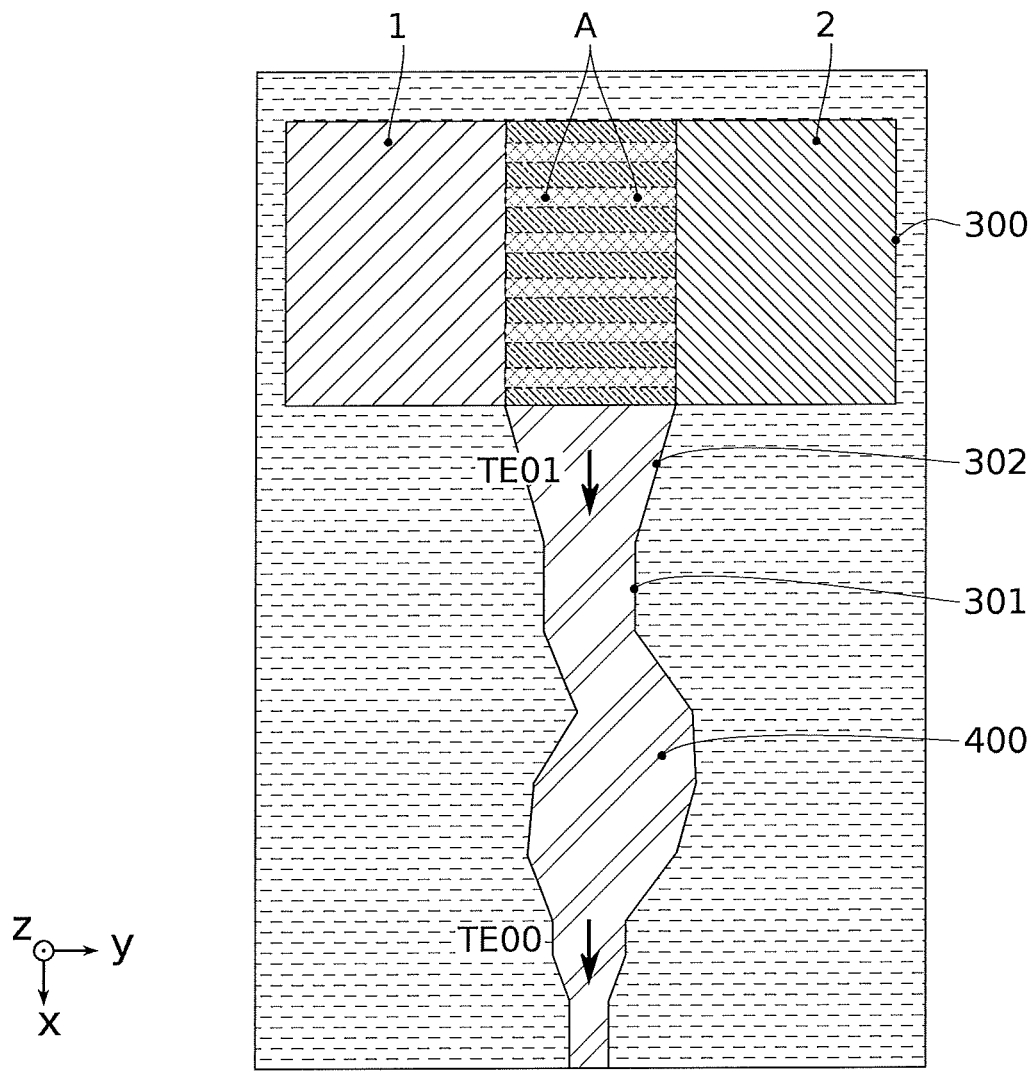
FIG. 32 shows a light source according to the fourth embodiment of the present invention coupled with a mode converter.

Such a converter 400, comprising for example different sections, off-centred and extended with respect to the direction x of propagating the light flow, is represented in FIG. 32.

It can function for a wavelength of between 1.6 μm and 4 μm.

It is preferably configured to convert the mode TE01 into a Gaussian mode TE00 with a conversion efficiency greater than or equal to 95%, for example of around 97%, even around 99%.

Figure 33:
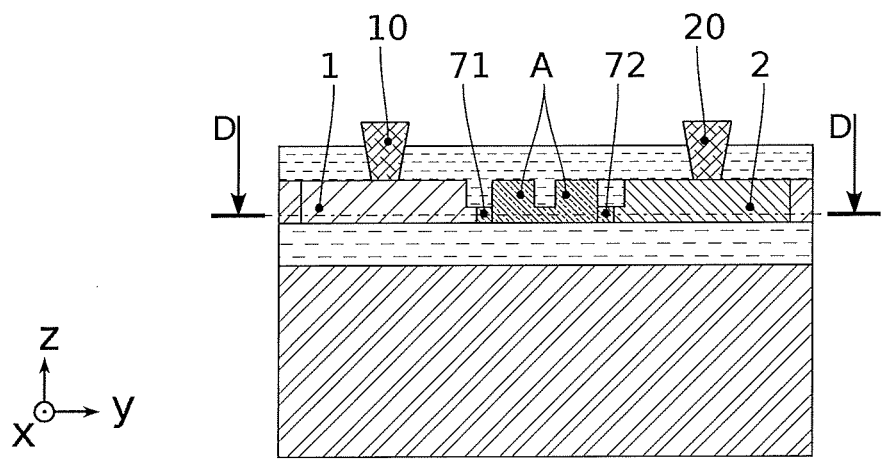
FIGS. 33 to 34 illustrate steps of producing a light source according to a fifth embodiment of the present invention.
Figure 34:
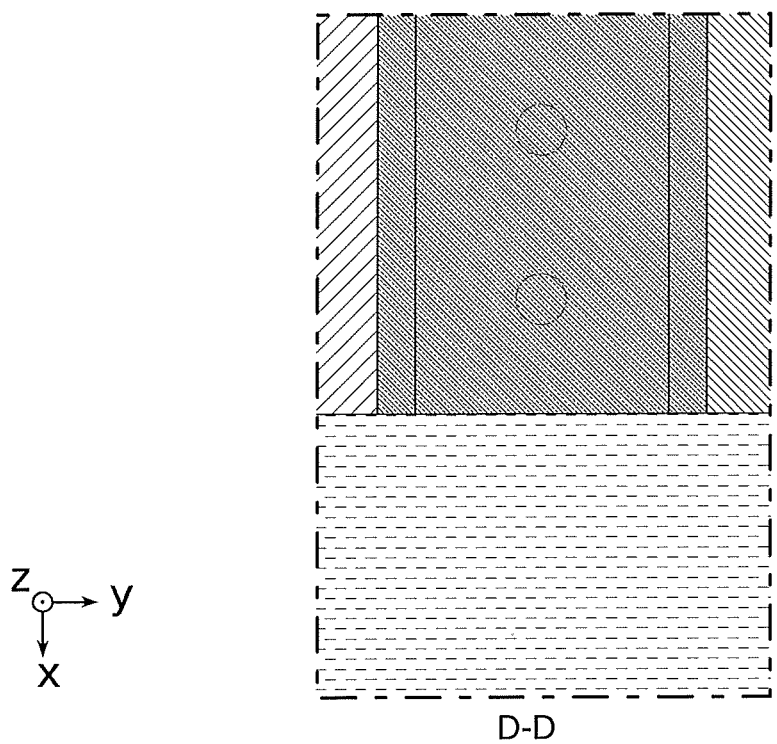

According to a fifth embodiment illustrated by FIGS. 33 and 34, the two sections 51$a$ and 51$b$ of the GeSn active zone A can be conserved and encapsulated without forming any DBR.

The injection of carriers in the active zone A subsequently makes it possible to emit a non-coherent light.

The light source obtained by this fifth embodiment is an LED-type source.

Optionally, one or more of the waveguides can also be coupled to this source, for example by way of one or more tapers, so as to collect at least partially and to guide the diffused light emitted by this non-directional source.

Figure 35:
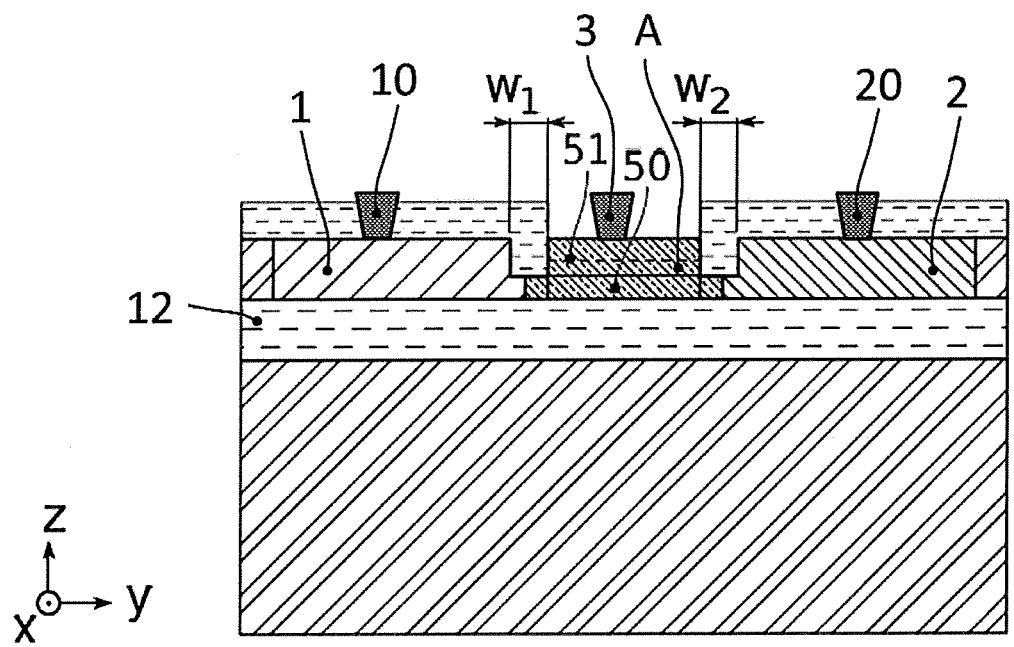
FIG. 35 shows a light source according to a sixth embodiment of the present invention.

According to a sixth embodiment illustrated in FIG. 35, the contact zones 1, 2 can be made of one same material and/or have one same doping type, for example Si-n, and the central zone comprising the layers 50, 51 can have a complementary doping type, for example GeSn-p or InP-p. In particular, the central zone can be presented in the form of a stack along z comprising, starting with the BOX 12, the following regions: an n+ region formed in the base layer 50, for example InP-n+, an active zone A formed in the structural layer 51, for example InP-i with InGaAs quantum wells, a p+ region formed in the structural layer 51, for example InP-p+.

The contact zones 1, 2 are subsequently connected to n contacts 10, 20 and the central region is connected to a p contact 3. This light source architecture makes it possible to improve the distribution of electric current lines within the active zone A.

The invention is not limited to the embodiments described above and extends to all the embodiments covered by the claims.

For example, the GeSn-based structural layer 51 can comprise other layers, for example made of SiGeSn, so as to form heterostructures or GeSn-based quantum wells during the homoepitaxy. Such quantum wells improve the confinement of carriers in the active zone A. Alternatively, the InP-based structural layer 51 can comprise InGaAs-based quantum wells.

The invention claimed is:

1. A method for producing a light source comprising a first contact zone, a second contact zone and an active zone juxtaposed parallel to a first direction of a basal plane, said active zone being located between the first and second contact zones along a second direction of the basal plane, said method comprising:
   providing a first substrate comprising a stack along a third direction normal to the basal plane of a first layer made from a first material on a second layer made from a second material differing from the first material,
   forming, at the level of the first layer, the first contact zone,
   forming, at the level of the first layer, the second contact zone, and
   forming, at the level of the first layer, the active zone,
   wherein the active zone comprises a base layer, said base layer being formed with the following successive steps:
   removing the first material in the active zone over the whole thickness of the first layer so as to expose, on one hand, a portion of a lower face made from the second material, and on another hand, at least one face made from the first material normal to the basal plane, called lateral germination face, having an edge in contact with said exposed lower face,
   forming a germination layer in a third material with a first epitaxial growth, called first lateral growth, of said third material from the at least one lateral germination face, said first lateral growth being mainly directed along the second direction and at least partially guided by the exposed portion of the lower face, the germination layer only partially covering the exposed portion of the lower face such that the germination layer has at least one face made from the third material normal to the basal plane, called lateral base face, and
   forming the base layer in a fourth material differing from the third material, with a second epitaxial growth, called second lateral growth, of said fourth material from the at least one lateral base face, said second epitaxial growth being mainly directed along the second direction and at least partially guided by the exposed portion of the lower face, such that the exposed portion of the lower face is fully covered.

2. The method according to claim 1, wherein the active zone comprises a structural layer in a fifth material made from said fourth material, said structural layer being formed with an epitaxial growth, called vertical growth, of the fifth material along the third direction from an exposed portion of an upper face of the base layer.

3. The method according to claim 2, wherein the formation of the structural layer further comprises, before the vertical growth, the following step:
   forming at least one lateral layer having lateral walls substantially normal to the basal plane made of a material differing from the first material, said at least one lateral layer bearing on a face parallel to the basal plane comprising the upper face of the base layer, wherein the vertical growth leading to the formation of the structural layer is at least partially guided by said lateral walls.

4. The method according to claim 1, wherein the at least one lateral layer has a width along the second direction greater than or equal to 10 nm and/or less than or equal to 100 nm.

5. The method according to claim 1, wherein the removal of the first material in the active zone over the whole thickness of the first layer comprises the following successive steps:

removing the first material from the first layer by conserving a sacrificial layer made from the first material on the second layer, said sacrificial layer having a residual thickness e along the third direction and a width w along the second direction, encapsulating the sacrificial layer by an encapsulation layer made of an encapsulation material differing from the first material, forming at least one opening through the encapsulation layer so as to expose a zone of the sacrificial layer, and forming a cavity of width ws by removing the first material over the whole residual thickness of the sacrificial layer through the at least one opening, so as to expose the lower face made from the second material, the at least one lateral germination face and a face of the encapsulation layer, the cavity comprising said at least one lateral germination face, a lower wall formed by said lower face and an upper wall parallel to the basal plane and made from the encapsulation material formed by said face of the encapsulation layer, wherein the first lateral growth leading to the formation of the germination layer and the second lateral growth leading to the formation of the base layer are at least partially guided by said lower and upper walls, the germination layer and the base layer having thicknesses equal to the residual thickness e.

6. The method according to claim 5, wherein the width ws of the cavity is less than the width w of the sacrificial layer, such that the sacrificial layer forms at least one step between the second layer and the first layer.

7. The method according to claim 5, wherein the at least one opening has a closed edge and is distant from at least one from among the first and second contact zones by a distance d along the second direction such that 0.6 µm<d<1.5 µm and preferably 1.1 µm<d<1.5 µm.

8. The method according to claim 1, wherein the first, third and fourth materials each have a crystallographic structure of cubic type, and wherein the first direction corresponds to a crystallographic orientation of type [100], the second direction corresponds to a crystallographic orientation of type [010], and the third direction corresponds to a crystallographic orientation of type [001].

9. The method according to claim 1, wherein the second lateral growth has a first growth front from a first lateral base face and a second growth front from a second lateral base face, said first and second growth fronts are joined at the level of a joining zone to form the base layer, and wherein the base layer comprises said joining zone.

10. The method according to claim 9, wherein the base layer is partially etched along the third direction at the level of the joining zone.

11. The method according to claim 2, wherein the structural layer is partially etched along the third direction at an area extending from the joining zone.

12. The method according to claim 1, wherein the first material is silicon, the second material is a dielectric material, the third material is germanium and the fourth material is a germanium-tin GeSn alloy.

13. The method according to claim 1, wherein the germination layer has a width greater than or equal to 10 nm and/or less than or equal to 100 nm.

14. The method according to claim 1, wherein the base layer has a thickness greater than or equal to 10 nm and/or less than or equal to 50 nm.

15. The method according to claim 1, wherein the germination layer has a thickness greater than or equal to 10 nm and/or less than or equal to 50 nm.

16. The method according to claim 1, further comprising a step of forming distributed Bragg reflectors along the first direction in an upper portion of the active zone.

17. The method according to claim 1, wherein the first substrate comprises a third layer, such that the second layer is inserted between the first and third layers along the third direction, the method further comprising a sequence of steps of flipping the light source on a second substrate, said sequence comprising:

providing a second substrate, bonding by molecular adhesion, the second substrate to the first substrate along the third direction, the first layer of the first substrate being rotated facing the second substrate, removing the third layer of the first substrate, and forming, through the second layer of the first substrate, first and second metal contacts respectively on the first and second contact zones.

18. The method according to claim 1, wherein the first lateral growth leading to the formation of the germination layer is achieved at least partially at a first temperature T1 of between 400° C. and 450° C., and the second lateral growth leading to the formation of the base layer is achieved at a second temperature T2 of between 300° C. and 400° C.

19. A light source comprising a first contact zone, a second contact zone and an active zone formed in a first layer made from a first material and juxtaposed so as to extend parallel along a first direction, said active zone being located between the first and second contact zones along a second direction, the first layer being in contact with a second layer made from a second material differing from the first material, along a third direction perpendicular to the first and second directions, the light source comprising a germination layer in a third material differing from the first and second materials and directly in contact with the second material of the second layer, said germination layer being inserted along the second direction between the active zone and at least one from among the first and second contact zones, and wherein the active zone is formed along a thickness of the first layer and comprises a fourth material with direct gap, mechanically relaxed and differing from the third material, this fourth material being directly in contact with the second material of the second layer and with the third material of the germination layer.

20. The light source according to claim 19, wherein the at least one from among the first and second contact zones has a step facing the other one from among the first and second contact zones, said step bearing on the second layer and being located between the first layer and the active zone.

21. The light source according to claim 19, wherein the germination layer has a thickness greater than or equal to 10 nm and/or less than or equal to 50 nm.

22. The light source according to claim 19, wherein the fourth material is germanium-tin or indium phosphorus alloy-based.

23. The light source according to claim 19, wherein the active zone is configured to emit a light flow being propagated mainly along the first direction according to an optical propagation mode of type TE01, called TE01 mode, further comprising a mode converter directly coupled to the active zone, said mode converter being configured to convert said TE01 mode into an optical propagation mode of type TE00, called TE00 mode, preferably with a conversion efficiency greater than or equal to 95%, and more preferably with a conversion efficiency greater than or equal to 97%.

* * * * *